(12) United States Patent
Grudin et al.

(10) Patent No.: US 7,555,829 B2
(45) Date of Patent: Jul. 7, 2009

(54) METHOD FOR ADJUSTING AN OUTPUT PARAMETER OF A CIRCUIT

(75) Inventors: Oleg Grudin, Montréal (CA); Leslie M. Landsberger, Westmount (CA); Gennadiy Frolov, Montréal (CA)

(73) Assignee: Microbridge Technologies Inc., Montreal, Quebec (CA)

( * ) Notice: Subject to any disclaimer, the term of this patent is extended or adjusted under 35 U.S.C. 154(b) by 255 days.

(21) Appl. No.: 10/564,475

(22) PCT Filed: Jul. 14, 2004

(86) PCT No.: PCT/CA2004/001030
§ 371 (c)(1), (2), (4) Date: Jul. 25, 2006

(87) PCT Pub. No.: WO2005/006100
PCT Pub. Date: Jan. 20, 2005

(65) Prior Publication Data
US 2007/0013389 A1 Jan. 18, 2007

Related U.S. Application Data

(60) Provisional application No. 60/486,418, filed on Jul. 14, 2003.

(51) Int. Cl.
*H01C 17/00* (2006.01)
(52) U.S. Cl. .......... 29/610.1; 29/592.1; 29/612; 29/620; 29/825; 29/829; 219/494; 219/505; 257/538; 257/539; 257/E27.047; 338/195; 338/320; 438/238; 438/382

(58) Field of Classification Search .......... 29/610.1, 29/592.1, 612, 620, 825, 829; 219/494, 505; 257/538, 539, E27.047; 338/195, 320; 438/238, 438/382
See application file for complete search history.

(56) References Cited

U.S. PATENT DOCUMENTS 3,493,848 A * 2/1970 Galloway .......... 323/327

(Continued)

FOREIGN PATENT DOCUMENTS

WO  WO03023794  3/2003

OTHER PUBLICATIONS

International Search Report dated Jan. 31, 2005 from International Patent Application No. PCT/CA2004/001030.
Y. Amemiya, T. Ono, K. Kato: "Electrical Trimming of Heavily Doped Polycrystalline Silicon Resistors", IEEE Trans. Electron. Dev. vol. ED-26 (1979), 11, pp. 1738-1742.

(Continued)

*Primary Examiner*—Thiem Phan
(74) *Attorney, Agent, or Firm*—Ogilvy Renault, LLP

(57) ABSTRACT

Electro-thermal trimming of thermally-trimmable resistors is used to trim one or more of the plurality of resistors in or associated with an analog electric circuit. The TCR of each of a subset of a plurality of electro-thermally-trimmable resistors can be trimmed independently from the resistance in order to adjust the output parameter of an analog electric circuit without changing other parameters that would be affected by a change in resistance.

25 Claims, 20 Drawing Sheets

U.S. PATENT DOCUMENTS

| | | | |
|---|---|---|---|
| 3,887,863 | A | 6/1975 | Brokaw |
| 4,210,996 | A | 7/1980 | Amemiya et al. |
| 4,250,445 | A | 2/1981 | Brokaw |
| 5,252,908 | A | 10/1993 | Brokaw |
| 5,679,275 | A * | 10/1997 | Spraggins et al. ........... 219/505 |
| 6,306,718 | B1 * | 10/2001 | Singh et al. ................. 438/382 |
| 2003/0006831 | A1 | 1/2003 | Coady |

OTHER PUBLICATIONS

J. Babcock, P. Francis, R. Bashir, A. Kabir, D. Shroder, M. Lee, T. Dhayagude, W. Yindeepol, S. Prasad, A. Kalnitskiy, M. Thomas, H. Haggag, K. Egan, A. Bergemont, P. Jansen, "Precision Electrical Trimming of very Low TCR Poly-SiGe Resistors", IEEE Electron. Dev. Letters, vol. 21 (2000), 6, pp. 283-285.

* cited by examiner

METHOD FOR ADJUSTING AN OUTPUT PARAMETER OF A CIRCUIT

CROSS-REFERENCE TO RELATED APPLICATIONS

This application is a national phase entry of international application number PCT/CA2004/001030, which claims priority under 35USC§119(e) of U.S. provisional patent application 60/486,418 filed on Jul. 14, 2003, which is hereby incorporated by reference.

FIELD OF THE INVENTION

The invention relates to adjustment of output parameters of analog circuits. More specifically, it relates to adjusting output parameters of analog circuits by trimming parameters of components within a circuit.

BACKGROUND OF THE INVENTION

Calibration of an output parameter of an analog circuit typically depends on adjustment of one or more adjustable components within that circuit. For example, voltage references are a typical precision analog circuit, where adjustment may be required.

In some cases, the adjustable component is a resistor, and the output parameter of the circuit may be directly adjusted by trimming the resistance value of the resistor. However, there are also many cases of electric circuits where the dependence of the output parameter on the resistor may be indirect. For example, the temperature variation of the output parameter may be affected by the resistance value. In most cases, the behavior of certain resistors in a circuit will have an impact, whether direct or indirect, on the behavior of the output parameter of the entire circuit.

Voltage reference circuits are used in larger electric circuits in cases where a known and stable reference voltage is desired, from which to derive other voltages in the larger circuit. For example, 16-bit absolute resolution corresponds to roughly 15-ppm precision in a reference voltage. The precision and accuracy of the voltage reference are of paramount importance in the usefulness of a voltage reference in an electric circuit. This fact is manifest in the price-performance strata in the market for voltage references.

Schematics of typical voltage reference circuits from the prior art are shown in FIGS. 20 and 21. In most cases, there are a plurality of resistors, whose purpose is generally to adjust the output voltage in the desired output range, and adjust the coefficients of temperature variation of the output voltage to be preferably close to zero.

Devices, such as voltage references, made by modern CMOS or BICMOS process technologies suffer from unavoidable statistical spreads in device parameters, such as output voltage and temperature coefficients. If high-precision analog performance is desired, some form of high-precision calibration or trimming is therefore essential.

The resistors involved in a voltage reference may potentially be trimmed, for example by using laser trimming, Zener zapping, external manual trimpot, or other resistance trimming methods. Laser trimming can be done only before packaging, and has limited precision. Furthermore, during or after packaging, trimmed parameters can shift away from the required values. Zener zapping can be done after packaging, but has quite limited precision due to the on-chip area required for a configurable array of fixed resistors. Potential disadvantages of manual trimpots are their manual operation, and their relative temperature coefficient of resistance (RTCR) may be non-zero, which may degrade the temperature behaviour of the overall voltage reference.

One of the most popular physical voltage reference cell is the "bandgap cell", depicted in FIG. 20, which uses the base-emitter voltage ($V_{be}$) of a bipolar transistor to produce approximately 1.2V at −273° C. (0 K). This cell was the subject of a patent (U.S. Pat. No. 3,887,863). In order to serve as reference for other practical circuit voltage levels such as 2.0, 2.048, 2.5, 4.096, 5.0, 7.5 and 10.0V, an amplifier is typically involved, with an amplification factor, defined by a pair of resistors (included in the amplifier depicted in FIG. 20). This amplification requires a precisely-trimmed and predictable ratio of those resistors internal to the amplifier. For temperature stability of the overall voltage reference, the relative temperature coefficient of resistance (RTCR) of this pair of resistors is quite important. One or more other pairs of resistors, such as the pairs R3,R4 and R1,R2, and are also needed in the circuit, in order to compensate for the temperature dependence of $V_{be}$, which is approximately −2 mV/K. These other pairs of resistors must also be accurately tuned, to high precision, and their RTCR is also important. Another patent, (U.S. Pat. No. 4,250,445), and patent application (US#2003/0006831A1), teach that it is advantageous to be able to modulate the RTCR of such pairs of resistors. These pairs of resistors are commonly included on-chip, along with the physical cell and the amplifier, in commercial standard voltage reference integrated circuits.

Further pair or pairs of resistors, internal or external to the integrated chip, are also typically used with higher-quality voltage references, to fine-adjust the output reference voltage. An example of such a pair of resistors is shown as R5/R6 in FIG. 20. Many standard voltage references come with standard external pins for "trim", in order to allow the user to fine-adjust the reference voltage in a circuit using an external voltage divider.

This final adjustment could also be important even if the precision of the voltage reference is already sufficient for the desired application in the case where the output voltage needs to be trimmed away from an initial value. An example is in applications involving binary scaling (where one might need 10.24V Instead of 10.00V, for example), or to compensate for the voltage drop across the conductors on a printed-circuit board. In such cases the user would be responsible for the RTCR of the external voltage divider, and its influence on the overall temperature dependence. Typically the user may select a manual trimpot for this purpose. Note that, if the precision and/or temperature characteristics of this external trimpot are not matched to the quality of the voltage reference chip, this can substantially degrade the overall accuracy and stability of the output reference voltage. So, for high-end industrial trimpots, the user may typically use a high-quality multi-turn manual trimpot.

An approach similar to that outlined for the bandgap reference above is used with other types of physical reference cells, such as "Zener" reference cells shown in FIG. 21 (U.S. Pat. No. 5,252,908). In general, many voltage reference integrated circuits have a network of internal resistors, and often a provision for an external voltage divider. High-precision control of both the resistance values and RTCR is important in all of these resistances.

In the fine tuning of a voltage reference, it is typically relevant to consider voltage adjustment to precision in the range of a few ppm. Initial accuracy (without an externally-trimmed voltage divider) in the range of +/−200 ppm (~12 bit resolution) to +/−2000 ppm (~8 bit resolution) is typical of modern good-quality voltage references. Temperature coefficients of less than 1 ppm/K are typical for the best-quality voltage references.

Top-quality commercially-available industrial voltage references typically have +/−100 ppm absolute voltage accuracy. Voltage references based on the bandgap cell (FIG. 20) typically do not achieve this performance. Zener-based voltage references, similar to that depicted in FIG. 21, may achieve this performance but require substantially more power, tending to make Zener-based high-precision voltage references unsuitable for battery-powered applications.

Therefore, there is a need for a circuit and method which allows adjusting output parameters of circuits to a higher precision than the techniques of the state of the art.

SUMMARY OF THE INVENTION

The present invention improves trimming performance of analog electric circuits, such as voltage references, potentially trimmable by the manufacturer and also potentially trimmable by the user in some cases. Electro-thermal trimming of thermally-trimmable resistors is used to trim one or more of the plurality of resistors in or associated with an analog electric circuit. The TCR of each of a subset of a plurality of electro-thermally-trimmable resistors can be trimmed independently from the resistance in order to adjust the output parameter of an analog electric circuit without changing other parameters that would be affected by a change in resistance.

In the case of a voltage reference, a pair of electro-thermally-trimmable resistors, external to the voltage reference integrated circuit, such as R5 and R6 in FIG. 20, having trimmable resistance values, can be used as a voltage divider to trim the output voltage of the voltage reference.

A pair of electro-thermally-trimmable resistors, external to a voltage reference integrated circuit, such as R5 and R6 in FIG. 20, where the resistance values and RTCR are both trimmable, can be used as a voltage divider to trim both the output voltage and temperature coefficient of the output voltage of a voltage reference. If the output voltage without R5 and R6 has a substantial linear component of temperature variation, then trimming of RTCR of R5 and R6 can significantly reduce or eliminate such linear component of temperature variation.

Similarly a pair of electro-thermally trimmable resistors, integrated internally to a voltage reference, can be used to trim the output voltage, or output voltage and temperature coefficient, of a voltage reference.

Considering R1 and R2 in FIG. 20, in certain typical embodiments of voltage reference circuits, these two resistors are preferably trimmed to a predetermined resistance value. Additionally, they should preferably have the same TCR. A pair of electro-thermally-trimmable resistors as R1 and R2, where the resistance values and RTCR are both trimmable, can be used to change or improve the temperature behavior of the output voltage.

Considering R3 and R4 in FIG. 20, In certain typical embodiments of voltage reference circuits, these two resistors are preferably trimmed to a predetermined ratio. Additionally, they should preferably have the same TCR. A pair of electro-thermally-trimmable resistors such as R3 and R4, where the resistance values and RTCR are both trimmable, can be used to change or improve the temperature behavior of the output voltage.

Considering resistors R3 and R4 in FIG. 20, In certain typical embodiments of voltage reference circuits, such as described in (U.S. Pat. No. 4,250,445), the TCRs of these two resistors preferably have a predetermined difference, in order to compensate for non-linear temperature variation in the output voltage. A pair of electro-thermally-trimmable resistors as R3 and R4, where the resistance values and RTCR are both trimmable, can be used to accomplish such improvement in the output voltage.

Considering resistors R1 and R2 in FIG. 20, in certain typical embodiments of voltage reference circuits, such as described in (US#2003/0006831A1), the TCRs of these two resistors preferably have a predetermined difference, in order to compensate for non-linear temperature variation in the output voltage. A pair of electro-thermally-trimmable resistors such as R1 and R2, where the resistance values and RTCR are both trimmable, can be used to accomplish such improvements in the output voltage.

According to a first broad aspect of the present invention, there is provided a method for adjusting an output parameter of a circuit, the method comprising: (a) providing in the circuit a plurality of components including at least one thermally trimmable resistor and at least one other component, and positioning the at least one thermally trimmable resistor in the circuit such that the output parameter is affected by variations of parameters of the at least one thermally trimmable resistor; (b) trimming a resistance value and a temperature coefficient of resistance of the at least one thermally trimmable resistor to independent values to cause a change in the output parameter; and (c) measuring the output parameter.

Preferably, steps (b) and (c) are repeated until a desired output parameter is obtained.

According to a second broad aspect of the present invention, there is provided an apparatus for adjusting an output parameter of a circuit, the apparatus comprising: a circuit having a plurality of components including at least one thermally trimmable resistor and at least one other component, the at least one thermally trimmable resistor positioned in the circuit such that the output parameter is affected by variations of parameters of the at least one thermally trimmable resistor; heating circuitry having a decision-making module for applying heating cycles, each heating cycle comprising a sequence of heat pulses to trim a resistance value of the thermally trimmable resistor in a first direction and a sequence of heat pulses to trim the resistance value of the thermally trimmable resistor in an opposite direction, and wherein each heating cycle trims a temperature coefficient of resistance of the thermally trimmable resistor by an increment and thereby affects the output parameter of the circuit; and measuring circuitry for measuring the output parameter of the circuit.

BRIEF DESCRIPTION OF THE DRAWINGS

These and other features, aspects and advantages of the present invention will become better understood with regard to the following description and accompanying drawings wherein.

DETAILED DESCRIPTION OF THE PREFERRED EMBODIMENT

Throughout the description, the term "output parameter" should be understood as meaning any parameter representing a characteristic of an output signal, such as amplitude, voltage, current, frequency, sensor sensitivity, offset, gain, temperature variation (linearity, non-linearity, or an actual value thereof), etc.

The term "temperature coefficient of resistance", and its abbreviations "TCR", "RTCR", should be understood in general to include both linear and non-linear coefficients of temperature variation of resistance.

The term "active semiconductor device" should be understood to include diodes, transistors, metal-oxide-semiconductor devices, field-effect transistors, and any other non-passive electronic component made in a semiconductor wafer or chip.

While the prior art demonstrates that the TCR changes when one trims the resistance, it does not show how to trim the TCR while maintaining a constant resistance value.

This approach to trim the TCR of thermally-mutable materials such as polysilicon is based on certain experimentally observed phenomena, involving a hysteresis-like phenomenon, outlined below:

A polysilicon resistor trimmed from its as-fabricated resistance value $R_{init}$, down to a certain resistance, $R_{target}$, is known to experience a shift in TCR (known from U.S. Pat. No. 6,306,718). This effect is diagrammed in FIG. 1.

Figure 1:
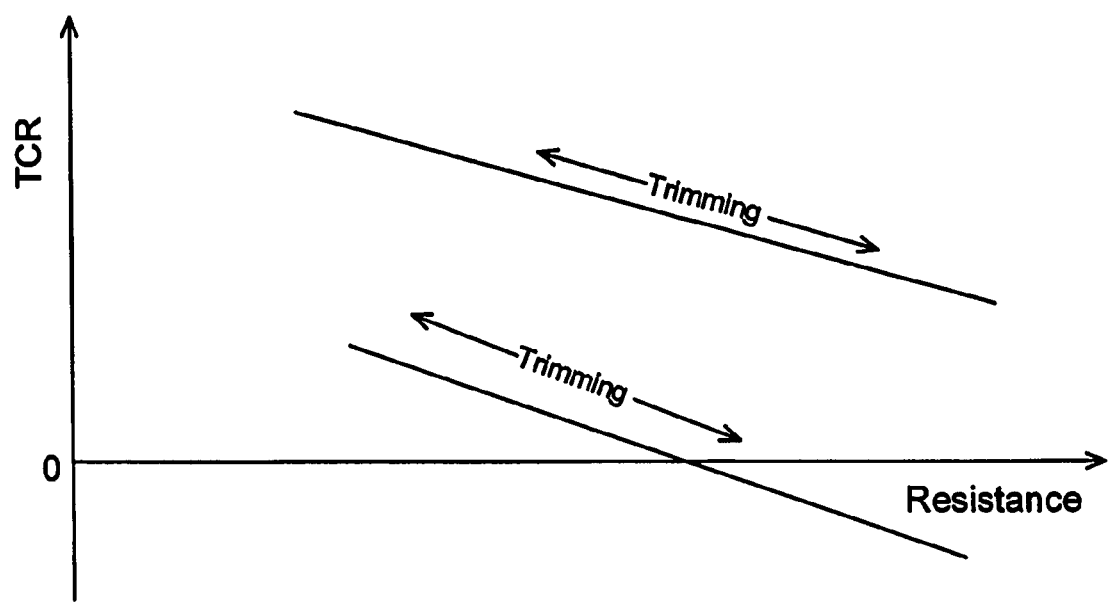
FIG. 1: Schematically describes the dependence of TCR on thermal trimming of resistance according to the prior art.

After such trimming, the resistor can be trimmed further "down", and then "recovered" back to $R_{target}$; or it can be "recovered" up to a certain intermediate resistance value higher than $R_{target}$, and then trimmed back "down" to $R_{target}$, in each case departing from $R_{target}$, and subsequently returning to the same $R_{target}$. Let us call such a cycle a "TCR-change cycle", or a heating cycle. The effect of such a cycle is to adjust the TCR of the resistance by a small amount (such as 100 ppm/K), above or below one of the typical curves in FIG. 1. In other words, one can maintain the resistance value constant while independently changing the TCR in a small range around the TCR value that would normally be correspond to a particular resistance value on a curve such as shown in FIG. 1.

The thermal cycling associated with the adjustment of resistance (either up or down) requires a series of heating pulses having sensitively different amplitudes. The tendency is that higher heating pulses result in trimming down. Pulses with lower amplitude result in resistance recovery or trimming down, depending on the recent thermal history.

It was experimentally found that a TCR-change cycle containing FIRST at least one heating pulse having rather high amplitude (to cause trimming down) and THEN a plurality of recovery pulses having lower (not necessarily constant) amplitude, results in a decrease of TCR. Fastest recovery is obtained by applying a sequence of pulses where each pulse is equal to or lower than the previous. If the next analogous TCR-change cycle contains another "first" heating pulse having higher amplitude than the previous one, the TCR will again decrease.

It was also experimentally found that, if, within a TCR-change cycle, the "first" heating pulse or pulses (which may give either a moderate decrease or increase in resistance), has amplitude substantially lower than the amplitude of the "first" pulse(s) in a recent TCR-change cycle which decreased TCR, then the TCR can be increased instead of decreased (Note that the determination of whether TCR was increased or decreased must be done after the resistance is restored to $R_{target}$).

Pulses slightly above (close to) the threshold for resistance trimming can increase the resistance value very slightly and gradually with only negligible changes in TCR.

Decreasing the TCR is found to be much less controllable than increasing the TCR, since increasing TCR requires a "first" pulse in the cycle having high pulse amplitude. It is also experimentally found that said TCR-change cycles having "first" heating pulses having low or moderate amplitudes result in gentle and gradual rise of TCR while reduction of TCR happens abruptly.

If it is desired to decrease TCR, one needs to first apply high-amplitude heating pulses, and then gentle resistance recovery pulses. If after the first TCR-change cycle, it is not decreased as needed, in the next cycle, the "first" high-amplitude pulse or pulses need to be at the same or higher amplitude as the "first" pulse or pulses of the previous decrease cycle. This is done until the TCR is below $TCR_{target}$. After that, one can apply much gentler TCR-change cycles (including lower amplitude first pulses) to gradually increase the TCR to its target.

There may be a "first"-pulse amplitude threshold for TCR decrease vs. increase, but this threshold appears to vary with thermal history and position in the available trimmable range.

The phenomena of TCR trimming appear to be most effectively described in terms of pulse amplitudes which cause resistance changes, as opposed to in terms of the resistance changes themselves. In other words, the effect on TCR of a pulse appears to be most related to its amplitude, as opposed to the resistance change which it causes.

Electro-thermal trimming allows to reduce resistance value of polysilicon resistor (or made from other polycrystalline material like Si—Ge) from its "as-manufactured" value $R_{ini}$ to a certain value $R_{min} \sim (0.30 \ldots 0.5)^*R_{ini}$. It is known that after trimming "down", increase of resistance ("recovery") is also possible, to an approximate value $R_{max}$, which is typically less than $R_{ini}$. Trimming of the resistance Ractual can be repeated many times between $R_{max}$ and $R_{min}$ ($R_{min} < R_{actual} < R_{max}$). Usually recovery is initiated by heating pulses lower than previously applied heating pulses which caused trimming "down." The same heating pulse may have different effects of trimming "up" or "down" depending on amplitude and effect of previously applied heating pulses. Therefore the result of an applied trimming pulse is sensitive to thermal "pre-history". The lower limiting value, $R_{min}$, is due to the fact that its further reduction requires higher heating pulses that may cause catastrophic damage to the resistor. Increase of the resistance higher than $R_{max}$ on the other hand, requires much longer trimming time, even hours (Babcock et al (J. Babcock, P. Francis, R. Bashir, A. Kabir, D. Shroder, M. Lee, T. Dhayagude, W. Yindeepol, S. Prasad, A. Kainitskly, M. Thomas, H. Haggag, K. Egan, A. Bergemont, P. Jansen, Precision Electrical Trimming of very Low TCR Poly-SiGe Resistots IEEE Electron. Dev. Letters, vol. 21 (2000), 6, pp. 283-285), Canadian Microelectronic Corporation Report #IC95-08 Sep. 1995). For very long trimming time, $R_{max}$ can be raised higher than $R_{ini}$ (Canadian Microelectronic Corporation Report #IC95-08 Sep. 1995, and O. Grudin, R. Marinescu, L. M. Landsberger, D. Cheeke, M. Kahrizi, "CMOS Compatible High-Temperature Micro-Heater: Microstructure Release and Testing," Canadian Journal of Elec. And Comp. Engineering, 2000, Vol. 25, No. 1, pp. 29-34). Practical trimming processes taking a few seconds are possible in the range $R_{min} < R_{actual} < R_{max} < R_{ini}$.

An adaptive algorithm for trimming a parameter value, such as a resistance, involves applying a sequence of pulses, interleaved with measurements of resistance, by which each pulse can learn from the previous sequence of pulses. The important principles of the adaptation may be peculiar to thermally-mutable materials such as polysilicon and polycrystalline SiGe.

The basic principles are:

In order to attain recovery which is fast over a wide resistance range, the pulse amplitudes are adaptively decreased, from one set of pulses to the next, in order to maintain a high rate of recovery. This adaptive decrease can be done until the threshold for resistance adjustment is reached.

In order to maximize the recovery range and speed to attain the greatest recovery range, the sequence of recovery pulses begins with a high-amplitude pulse, whose initial effect may be in some cases a large trim "down", and whose consequence is to allow more steps of decrease in pulse amplitude as described in (a) above. This allows recovery to higher resistance values. Note that the first high-amplitude pulse may be even higher than the last "down" pulse.

In order to maximize recovery speed for a given recovery range, the amplitude of the first high-amplitude pulse in (b) above, is to be chosen appropriately. For fast recovery over a moderate range, an intermediate amplitude of the first pulse in a recovery sequence is preferable.

In order to maximize the speed of recovery over an intermediate recovery range, the pulse amplitudes are decreased as soon as the recovery speed drops below a certain fraction of the initial speed at a given pulse amplitude.

In order to attain very precise recovery, pulses having amplitude just above the threshold for resistance change can be used, to obtain very low recovery rate, also in order to obtain very fine adjustment.

In order to accelerate trimming "down", especially when the desired magnitude of adjustment ("distance") is a significant fraction of the resistance value, the pulse amplitude is adaptively increased, depending on the decrement in resistance obtained by the previous pulse, and on the remaining "distance" to the target resistance.

Also in order to accelerate trimming "down", when high precision is not required, or when the remaining "distance" to the target is large, the time interval between pulses, during which the resistance is measured, can be shortened, (for example to 25 ms instead of 50 ms which would be needed for a high-precision accurate measurement).

In order to attain high-precision trimming, if the target resistance, $R_{target}$, is passed (during recovery), several cycles (trim down—recovery up) can be performed, where the pulse parameters from the previous cycle are "inherited" by the next pulse and processed such that the probability of passing the target is lower in the next cycle.

Figure 11:
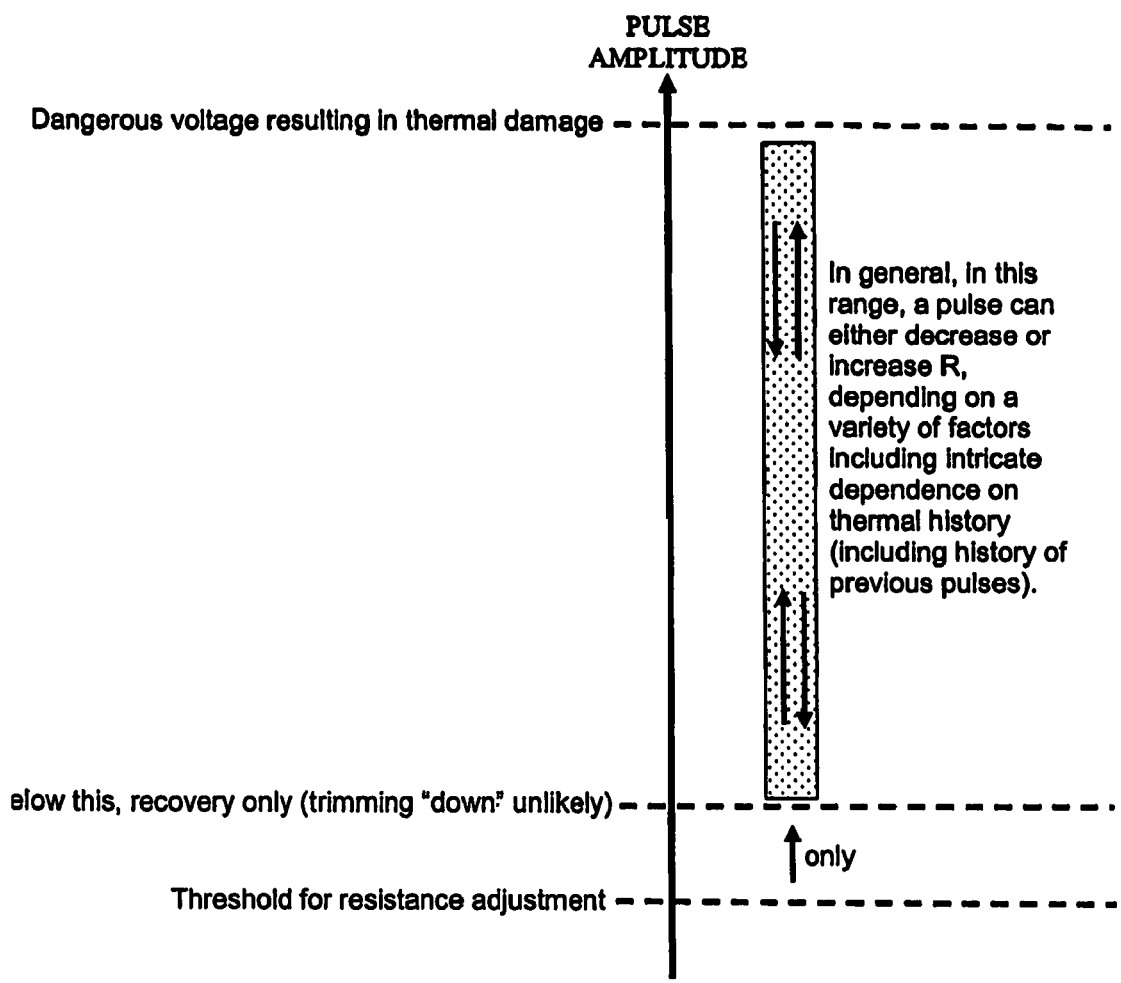
FIG. 11: Shows generally the trimming behavior vs. pulse amplitude.

FIG. 11 describes qualitatively the trimming behavior as a function of pulse amplitude above the threshold for resistance change. In particular, it indicates that the direction of trimming ("down" vs. recovery), resulting from a given pulse amplitude, can vary depending on a variety of factors, notably the thermal history of pulses applied, as well as microstructure layout, thermal isolation, resistivity, resistive material dimensions and grain parameters, heater layout and resistance. It also indicates the presence of a small range of pulse amplitudes, just above the threshold, which gives only recovery in most cases.

Figure 12:
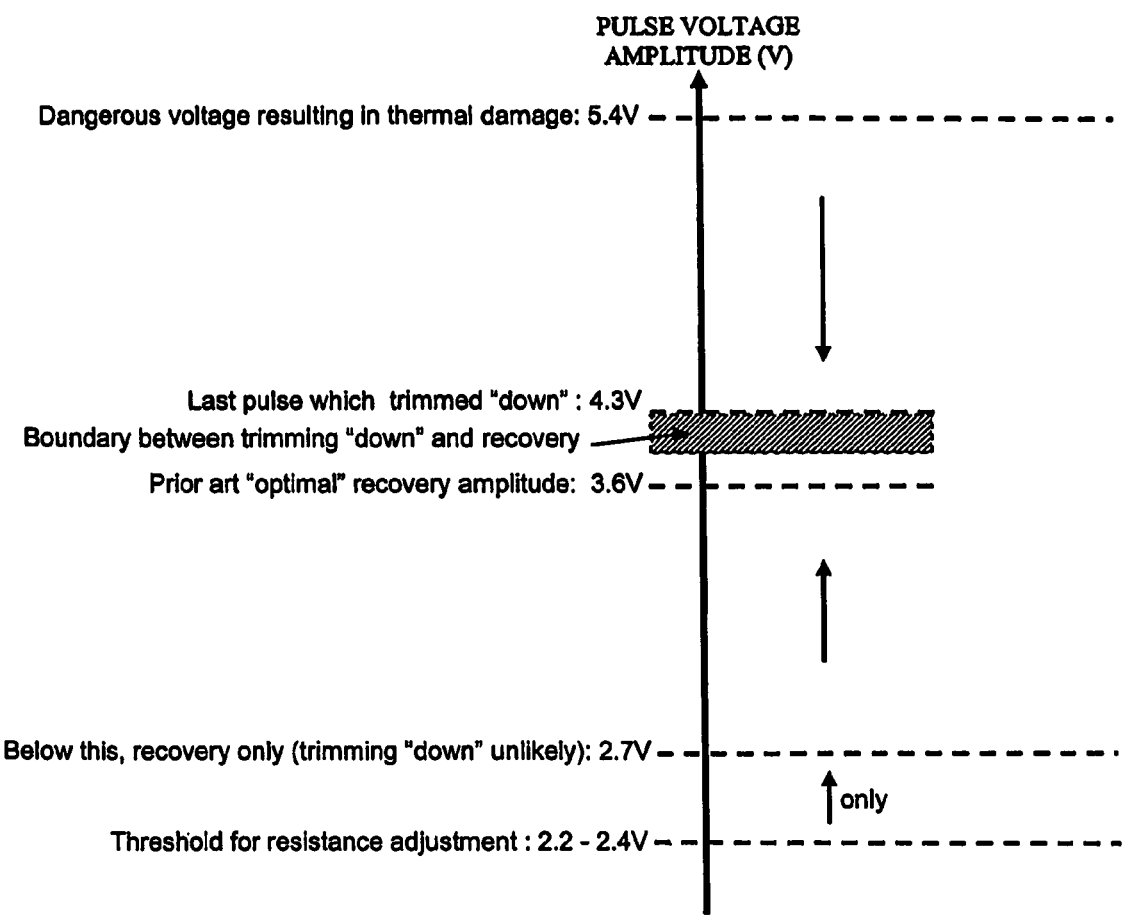
FIG. 12: Shows a quantitative example of the direction of trimming vs. pulse amplitude.

FIG. 12 gives a quantitative example of the trimming behavior, for a particular resistor, having as manufactured value 7200 Ohms, trimmed down to about 5500 Ohms, and having been trimmed bidirectionally several tens of times in the range of 5200 Ohms to 6500 Ohms, which had recently been subjected to a recent sequence of "down" pulses, ending at V=4.3V. In this case, the direction of trimming is strongly influenced by the amplitude of the last "down" pulse, (even if there are several other recovery pulses in between). There is a rough threshold above which short exposure at a given amplitude, or a sequence of pulses having increasing amplitude, causes decrease in the resistance.

Another trend observed in relation to the trimming of polysilicon is that if one continues to increase the amplitude of the applied pulses, eventually (usually after one or two such increasing pulses), one will achieve trimming "down". Also, if after trimming "down", one applies a sequence of pulses having decreasing amplitude, then eventually (usually after one or two such decreasing pulses), one will achieve "recovery". However, the behavior of the resistance as a function of exposure at a constant amplitude is not straightforward. Trimming "down" will be achieved for short enough accumulated time, but after longer exposure at that constant amplitude, the resistance will eventually rise, and can rise above its value at the beginning of the constant-amplitude exposure (but this could take hours).

In general, one important characteristic of electro-thermal resistor trimming is its dependence on thermal history. The same heating pulse may result in either increase or decrease of resistance, depending on the amplitude and effect of previous pulses. Thus, a "rigid" algorithm with fixed matching parameters may not be effective and accurate because the parameters of the heating pulses should essentially depend on a combination of conditions such as the difference between the as-manufactured resistance $R_{init}$ and the target resistance $R_{target}$, and the sign and magnitude of the difference between the present resistance $R_{actual}$ and the target resistance $R_{target}$, the positioning of $R_{actual}$ and $R_{target}$ with respect to $R_{init}$, and history of thermal cycles (which may not be known). Therefore a trimming algorithm with an adaptive character is preferable, where the heating pulse parameters (amplitude, pulse width and interval between pulses) are decided or adjusted based on analysis of previous heating pulses, resulting resistance changes, trimming rate, "distance" to target and required precision of next trimming shot.

Adaptive Decrease of Recovery Pulse Amplitude: Improvement of the recovery stage is based on the following experimentally-discovered phenomena. A polysilicon (p-type-doped having sheet resistance of 40 Ohms/square) resistor, called the "functional" resistor, with as-manufactured resistance of 7200 Ohms is located on a suspended microstructure. An auxiliary "heater" resistor with resistance of 960 Ohms is placed on the same microstructure close to the functional resistor, and serves to heat the micro-structure and trim the functional resistor. The functional resistor is connected in series with a constant metal resistor having resistance 21.9 kOhms, in a voltage divider configuration. A constant voltage of 2.5V is applied to this voltage divider, and the voltage drop across the functional resistor is measured using an automated (computer-controlled) data acquisition board (including an 8-channel 12-bit ADC and 4-channel 12-bit DAC). Then the resistance of functional resistor is calculated. Self-heating of the functional resistor caused by the measurement current (<100 μA), does not exceed 1.5° C. The data acquisition board is used also to apply voltage pulses to the heater (electrically isolated from functional resistor). The temperature rise in the described structure can exceed 600-700° C., causing a brightly glowing orange color, visible by microscope.

The functional resistor is trimmed down, using pulses from the DAC, to 5500 Ohms. Then the recovery stage is begun.

Figure 13:
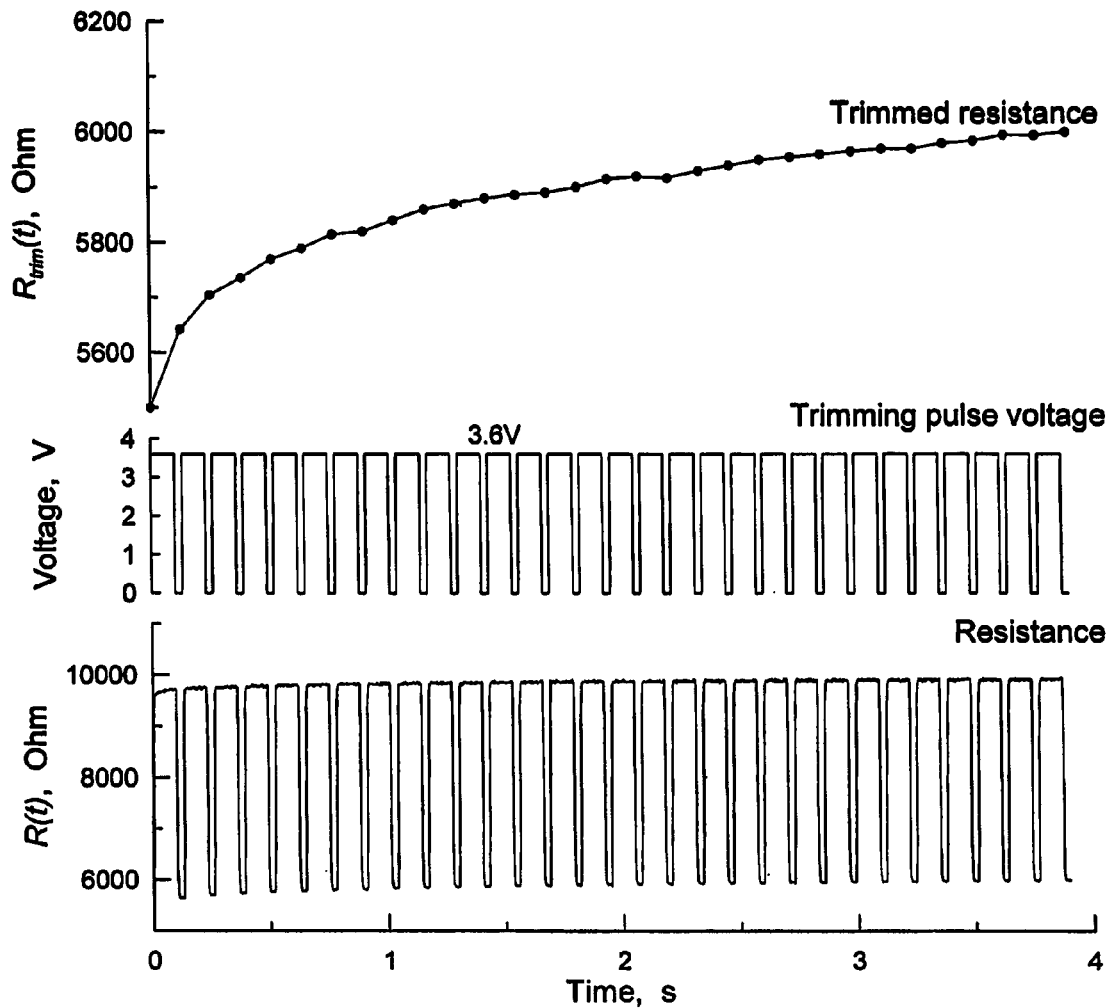
FIG. 13: Shows resistance recovery at a constant recovery voltage of 3.6V (near optimal, according to the prior art, about 85% of the last "down" pulse)
Figure 14:
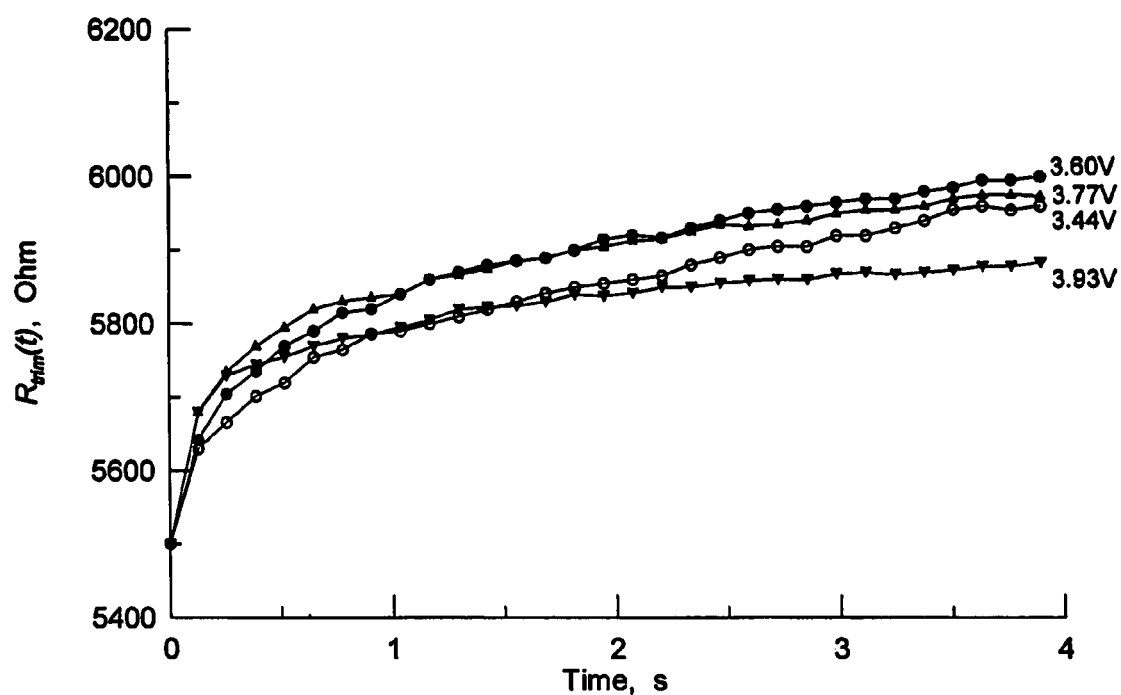
FIG. 14: Shows resistance recovery of the same resistor as in FIG. 13, at constant recovery voltages of 3.44V, 3.6V, 3.77V, 3.93V, demonstrating that 3.6V is near optimal, in accord with the prior art.

FIG. 13 shows the resistance recovery of the functional polysilicon resistor when a constant voltage of 3.6V is applied to the heater. The accompanying high temperature results in instantaneous resistance rise up to approximately 10000 Ohms, shown at the bottom of the figure. Periodically, every 130 ms, the heating voltage is turned off for and interval of 30 ms, in order to allow the structure to cool down. The so-trimmed resistance of the functional resistor, $R_{trim}$, is then measured at room temperature, at the end of the 30 ms interval. FIG. 13 shows the application of 30 pulses, each having amplitude 3.6V, the entire sequence taking approximately 4 seconds. At the end of this sequence, the resistance is seen to have increased by 500 Ohms, up to 6000 Ohms.

Figure 15:
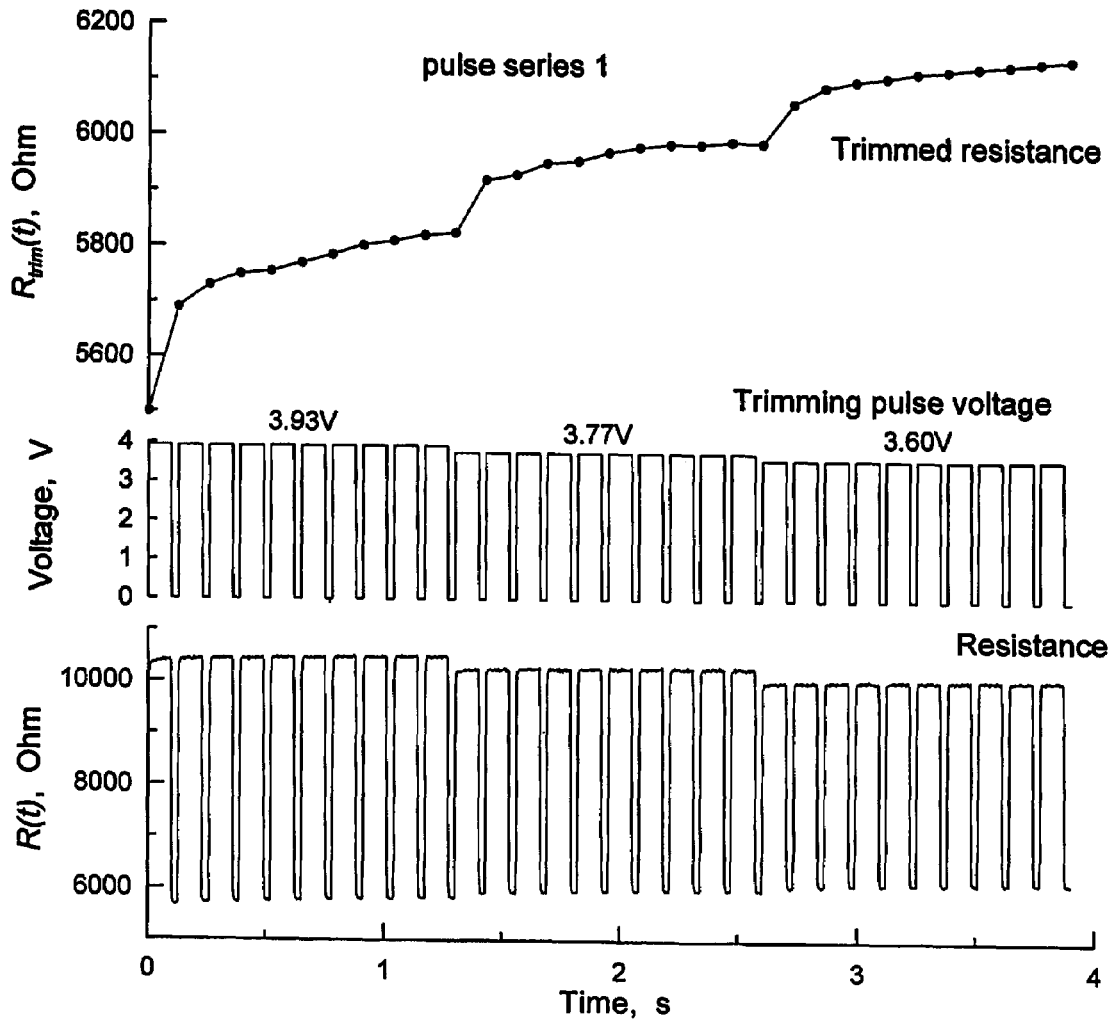
FIG. 15: Shows the result of pulse-series-1, an example of the invented decreasing sequence of recovery pulses, with acceleration of recovery at each decrement of pulse amplitude.
Figure 16:
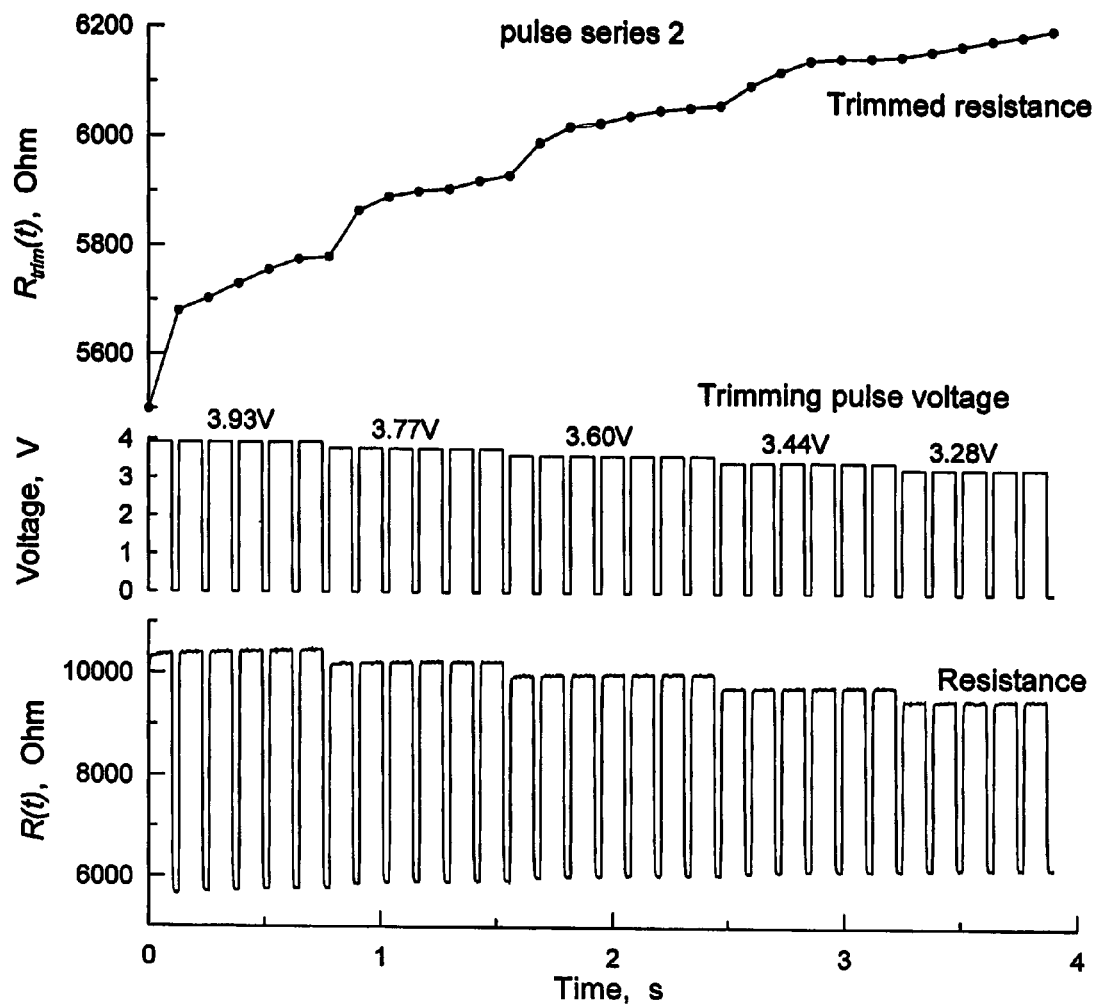
FIG. 16: Shows the result of pulse-series-2, another example of the invented decreasing sequence of recovery pulses.

Two examples are shown in FIGS. 15 and 16, where sequences of pulses having voltages 3.93V, 3.77V, and 3.60V (FIG. 15), and 3.93V, 3.77V, 3.60V, 3.44V, and 3.28V (FIG. 16), were used. Significantly greater recoveries of 640 Ohms and 700 Ohms were reached in the same 4-second time period.

Figure 17:
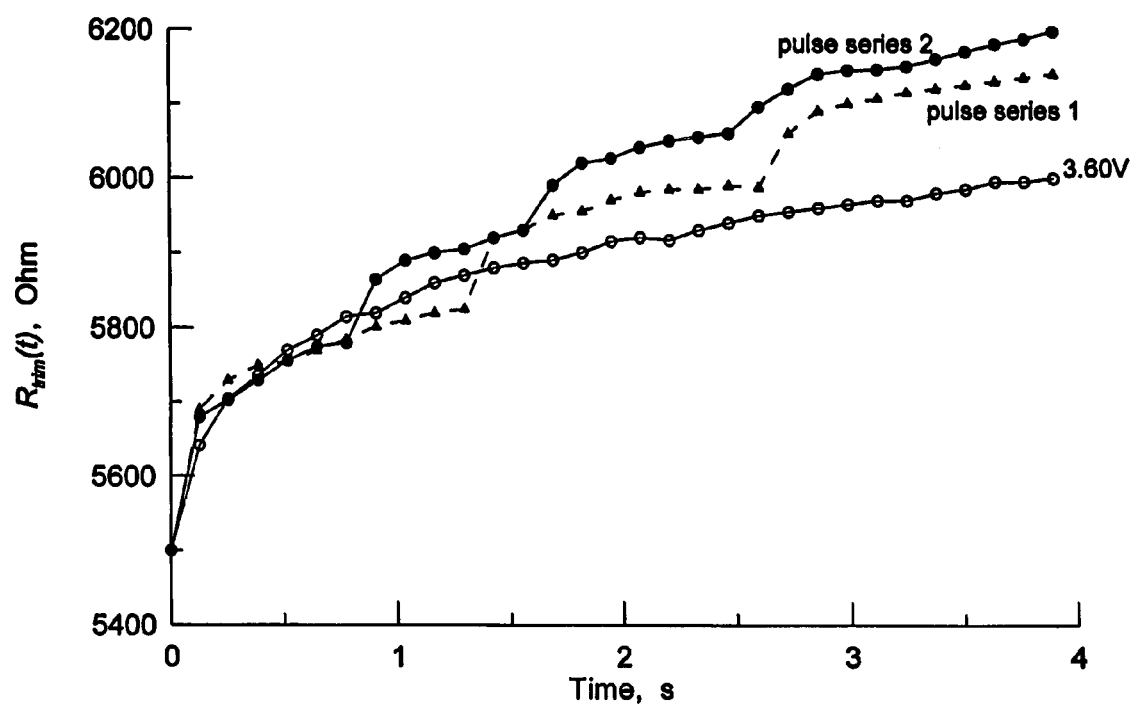
FIG. 17: Compares the speed and range of recovery of the sequences using adaptive decrements, with the speed and range of recovery of the sequence analogous to the prior art.

The above-described experiments, summarized for comparison In FIG. 17, demonstrate two advantages to the adaptive decreasing of heating-pulse amplitude: a) a greater recovery range can be attained; and b) an equal recovery range can be reached faster, (for example, a 500 Ohm recovery can be reached in less than 2 s using the adaptive pulse sequence.)

Figure 18:
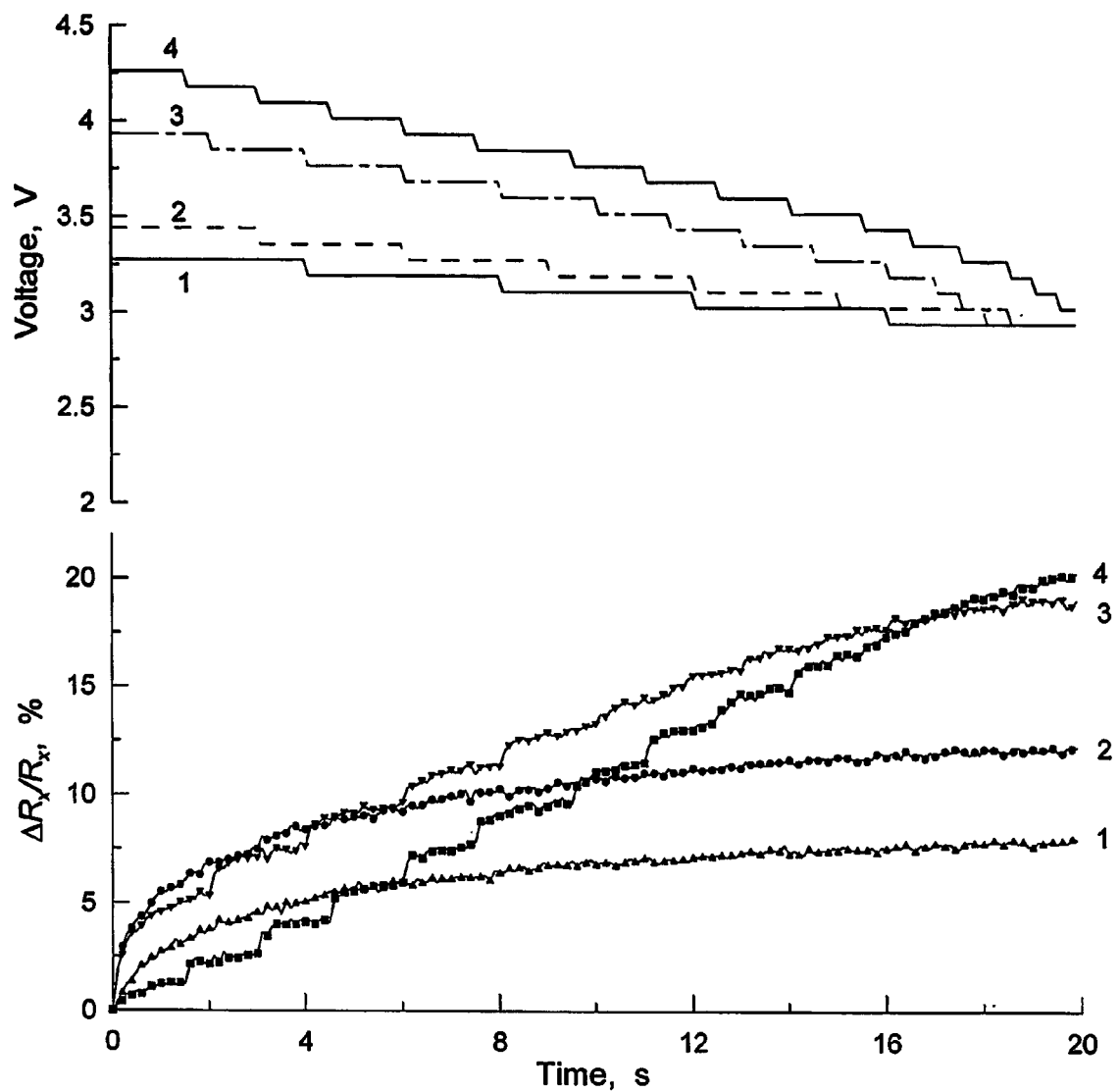
FIG. 18: Compares recoveries achieved from four 20-second recovery pulse sequences, each beginning at different pulse amplitudes, and ending at approximately the same pulse amplitude.

FIG. 18 compares "deeper" recoveries achieved from longer (20-second) recovery pulse sequences. Four 20-second recovery pulse sequences were selected, each beginning at different pulse amplitudes, and ending at approximately the same pulse amplitude. As was done in previous figures, heating was interrupted for 30 ms every 100 ms to record the room-temperature resistance, $R_{x1}$. For visual clarity, these interruptions are not shown in the figure. Thus, note that for these experimental 20-second sequences, the effective trimming time is 20 s*0.7=14 s (70 ms heating and 30 ms cooling). In practice, the adjustment algorithm could reduce these interruptions to enhance efficiency.)

Figure 10:
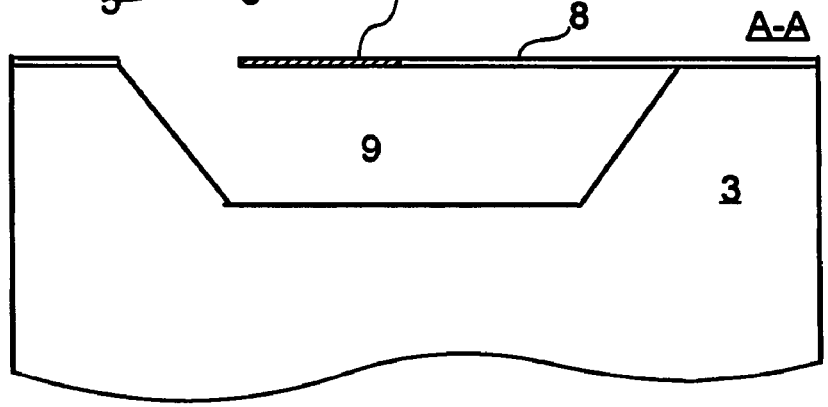
FIG. 10: is a cross-sectional view of the structure shown In FIG. 9.

High-Precision Recovery: For the purposes of effective, accurate and precise trimming, it is not only important to recover quickly—it is often important to recover intentionally very slowly. Otherwise approaching target resistance with accuracy of better than 100 ppm (0.01%) becomes problematic. Two techniques are presented, which can be used separately or in combination:

Use shorter recovery pulses, at a given recovery pulse amplitude;

Use lower recovery pulse amplitudes, just above the threshold for resistance change. Heating pulses with much lower amplitudes than mentioned in the examples above, can be used. FIG. 10 shows resistance recovery when heating pulses of 2.62V, 2.79V and 2.95V are applied (with otherwise the same experimental conditions as described above). The noise in resistance measurements is caused by the limited resolution of the 12-bit ADC, limits the accurate recording of fine changes in resistance obtained at 2.62V (and at lower voltages). An important experimental result is that the increase in heating pulse amplitude compared to the previous pulse gives an increase of the resistance (not a decrease as found by several authors in the prior art, who reported using heating pulses with increasing amplitude to trim resistance downward. The average resistance increases obtained at 2.62V were in the range of a few 100 ppm per pulse.

Usage of such low recovery rate, combined with short heating pulses, is useful and convenient because short heating pulses with easily-controlled duration of 5-30 ms, can give resistance increments as low as a few ppm or less.

Adaptive Regulation of Pulse Width and Interval Between Heating Pulses: In general, the requirements for high precision, say 0.01% or lower deviation from the target resistance, can be reached when the recovery rate is properly controlled. It is preferable to have high recovery rate when the "distance" from the target is substantial. On the other hand, recovery rate reduction is important in close vicinity to the target. Regulation of pulse width is an important tool to control recovery rate and improve trimming accuracy with reduction of total trimming time.

The measurement of temperature coefficients of circuit elements positioned on an integrated circuit involves heating a small volume or area of the integrated circuit, and measuring the generally-temperature-sensitive parameter of a circuit component while the component is at an elevated temperature.

Zero-Crossing Determination or Uncalibrated Measurement of Absolute Temperature Coefficient of a Single Component: Thus a preferred embodiment of this invention consists of a single resistive element positioned in or on a thermally-isolated microstructure, accompanied by a resistive heater, positioned in or on the same microstructure, or a closely adjacent microstructure placed above the same micromachined cavity. This basic configuration allows measurement of temperature coefficient(s) on an arbitrary or uncalibrated scale relative to zero, without requiring accurate knowledge of the actual temperature in the heated element. The heater heats the targeted element, and observation of the trend in the electrical parameter of the targeted element allows an uncalibrated measurement, and determination of whether that electrical parameter is positive, zero, or negative. If only such an uncalibrated measurement or a zero-crossing determination is required, then the heater may be on the same or a separate microstructure, and it does not need to be temperature-calibrated.

Measurement of Absolute Temperature Coefficient of a Single Component: If, on the other hand a measurement of the absolute temperature coefficient is required, then the heater must be calibrated such that it generates a known temperature at the functional component. Of course, the so-calibrated heater must remain stable and accurate, otherwise there must be a stable and calibrated temperature sensing device in the vicinity of the functional component. If, for example, the functional component is subjected to high temperature during operation (or, for example during thermal trimming), then this may make it necessary for the TCR-measurement heater to be placed on a separate microstructure such that it is not subjected to the highest temperatures (and thus remains more stable and calibrated). The initial calibration of the device used to sense the temperature may be done by several methods, including using an oven. After such calibration, (if it is stable), it may be used many times to measure the temperature coefficient of a targeted functional element.

Figure 7:
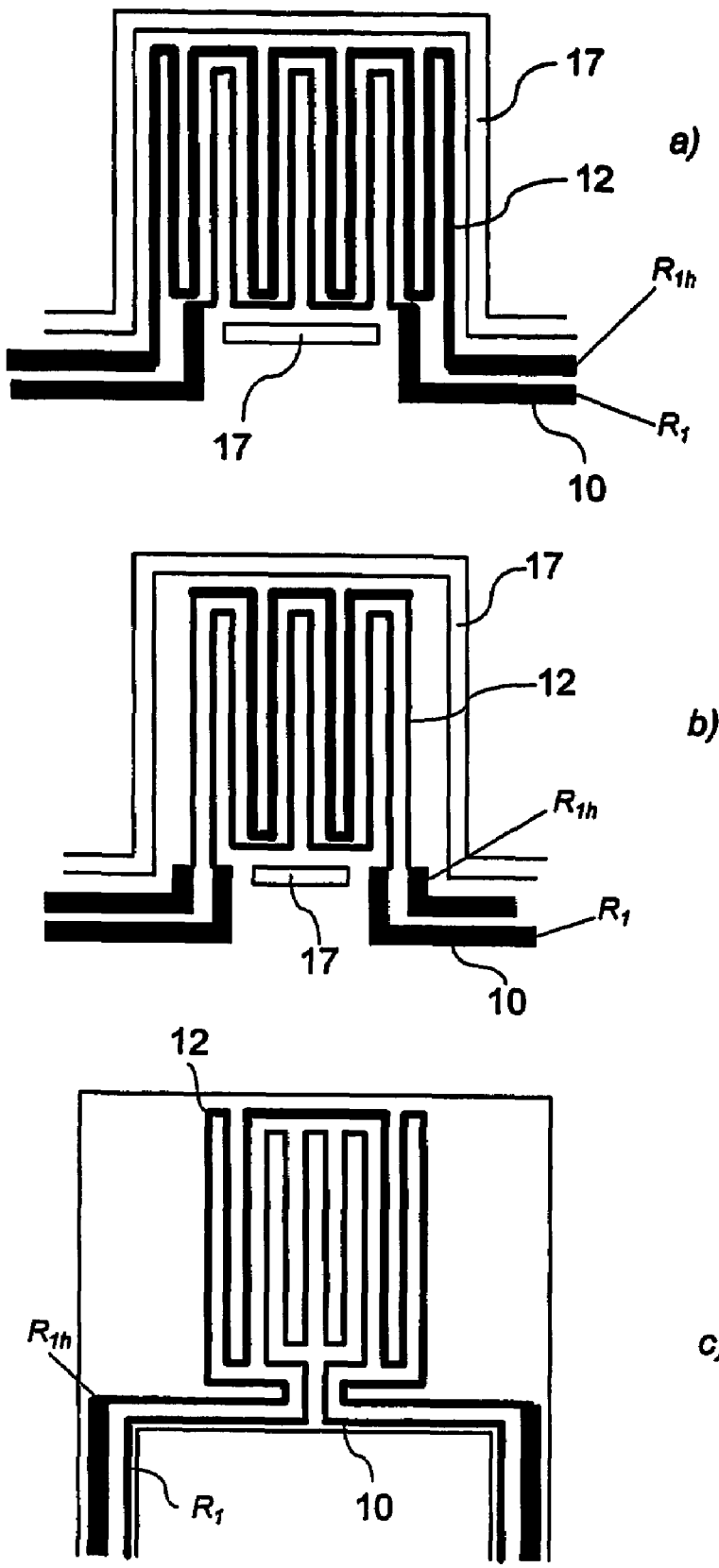
FIG. 7: shows three examples of layouts intended to dissipate more power at the edges of the heat-targeted region.

Uniform Temperature in Heated Component: Since the goal in measurement of temperature coefficient(s) is to imitate the effect of changes in the ambient temperature, effective determination or measurement of temperature coefficient(s) requires that the heated element be as much as possible at the same temperature. Therefore, measures should be taken to obtain a relatively constant temperature distribution in the heated element. For this purpose, we use layouts such as are shown in FIG. 7. Thus, for accurate control of heating in the functional resistor, it is important for the entire functional resistive element being heated to be maintained at the same (and controllable) temperature. Thus the spatial T profile, T(x) in the heat-targeted region, should be constant. However, since the heat-targeted element, even in steady state, is intended to be at a higher T than its surroundings, the boundaries of the heat-targeted region will tend to be at a temperature lower than the T at the center. In order to compensate for this, FIGS. 7a, 7b, and 7c show examples of layouts intended to dissipate more power at the edges of the heat-targeted region. More power can be dissipated at the edges of the heat-targeted region by increasing the resistive path around the perimeter, and/or increasing the resistivity of the elements at the perimeter. It is preferable to have a major portion of the functional resistor having a flat temperature distribution. Therefore, a power dissipation geometry for the heating element can comprise supplying more heat around the edges of the functional resistor in order to counteract a faster heat dissipation in the edges and resulting temperature gradients across the thermally-isolated micro-platform.

Figure 8:
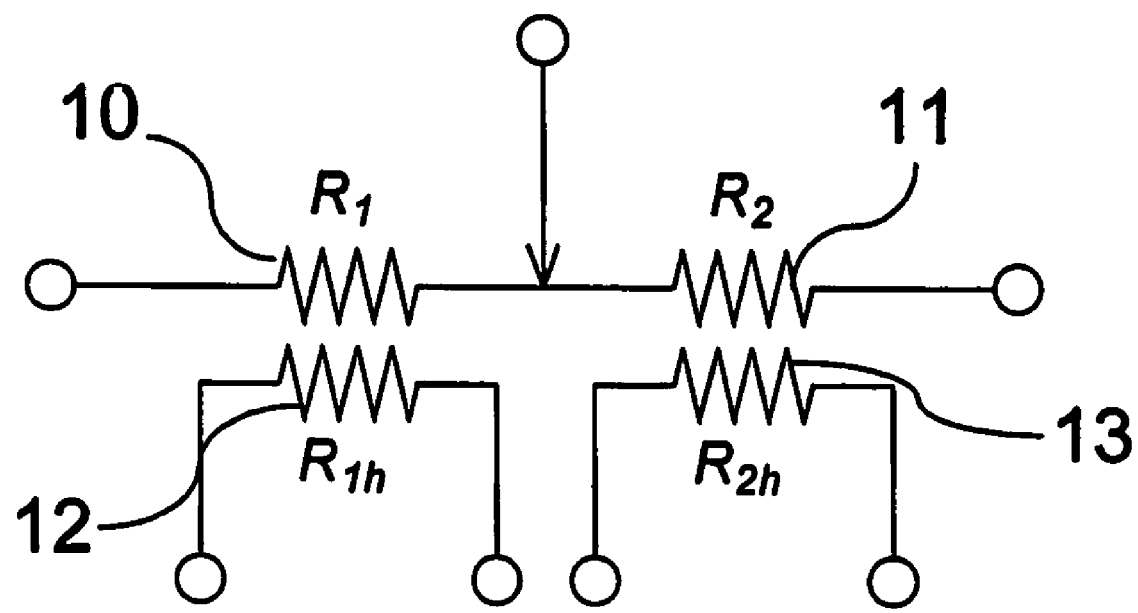
FIG. 8: shows the electrical schematic of two functional resistors, and two heating resistors electrically isolated from the functional resistors.
Figure 9:
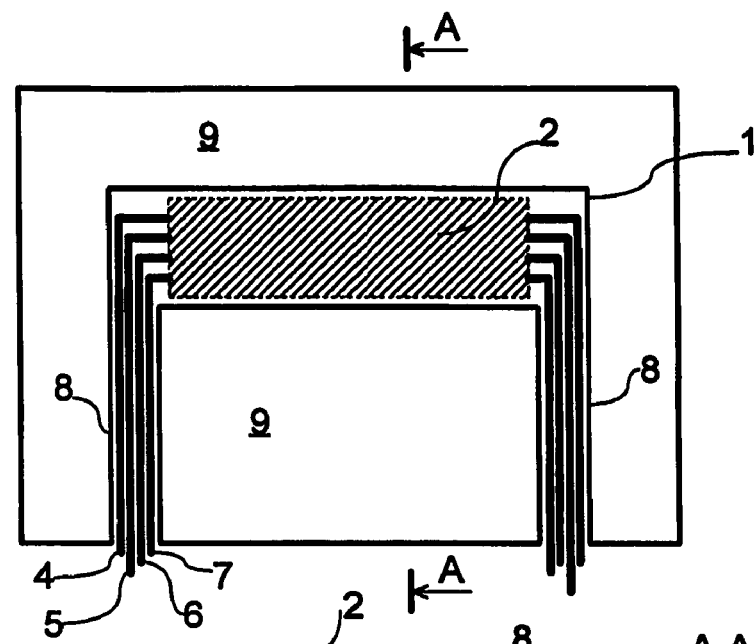
FIG. 9: is a top view schematic of a possible configuration of the micro-platform with four resistors, suspended over a cavity.

Zero-Crossing Determination or Uncalibrated Measurement of Relative Temperature Coefficient of a Plurality of Components Sharing an Operating Environment: For many applications, a combination of two or more resistors are used in a circuit. Some important cases include voltage dividers, R-R dividers, R-2R dividers, Wheatstone bridges, sensor input conditioning circuits, resistor networks. For example, the equivalent circuit of a simple voltage divider is shown in FIG. 8. These devices may be made to be very stable, even if the resistors have non-zero TCRS, as long as their TCR's are well-matched. For example, if the difference of the TCRs of the resistors is 0.001%/°K (10 ppm), then a temperature imbalance of 10°K will give a resistance mismatch of 100 ppm. In such cases, it can be important to measure the relative temperature coefficients, or at least to determine whether the relative temperature coefficients of two components is positive, negative, or zero. In such as case when the goal is to match the relative temperature coefficients, it is often not important that the measurement of the deviation from zero be calibrated. One possible configuration of this case is shown schematically in FIGS. 9-10. In this embodiment, two resistors are placed on the same thermally-isolated microstructure, and one or more heaters are additionally placed on the same thermally-isolated microstructure, in order to heat them.

Figure 2:
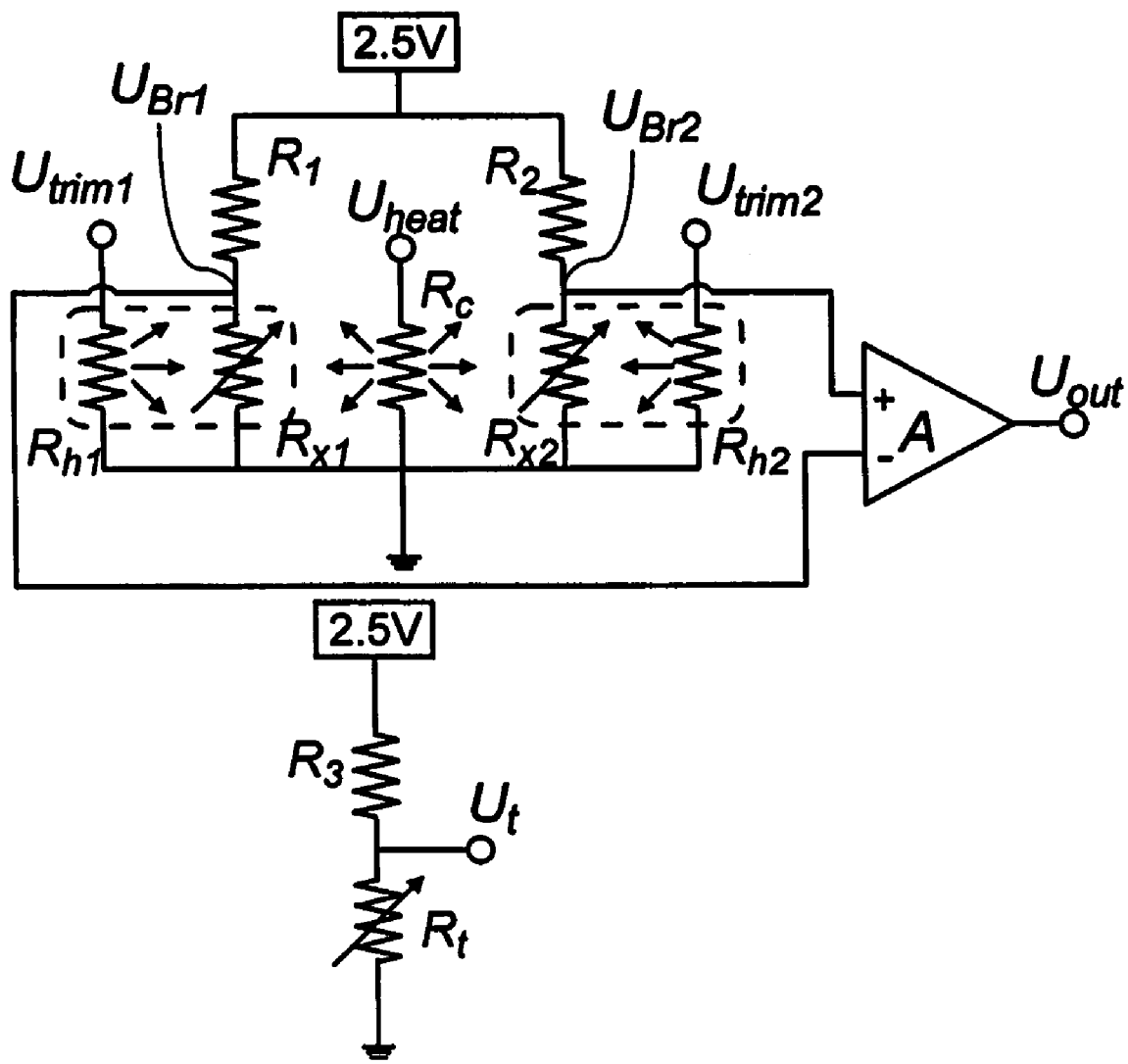
FIG. 2: Shows electronic circuitry with two trimmed polysilicon resistors and adjustable relative TCR.
Figure 3:
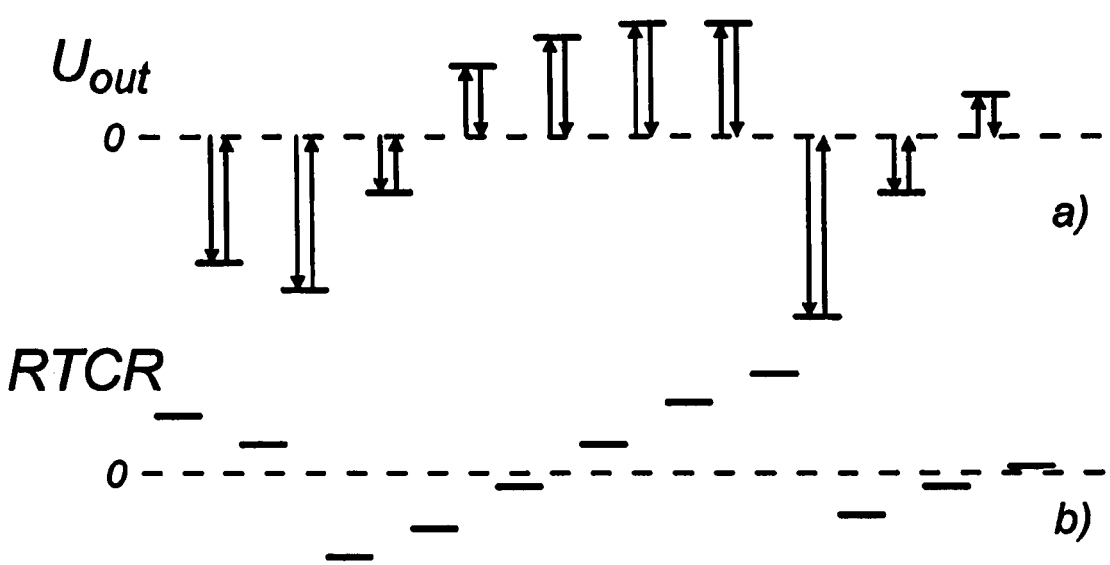
FIG. 3 is a graph showing a change in RTCR that accompanies a trimming and recovery cycle of a resistance.
Figure 4:
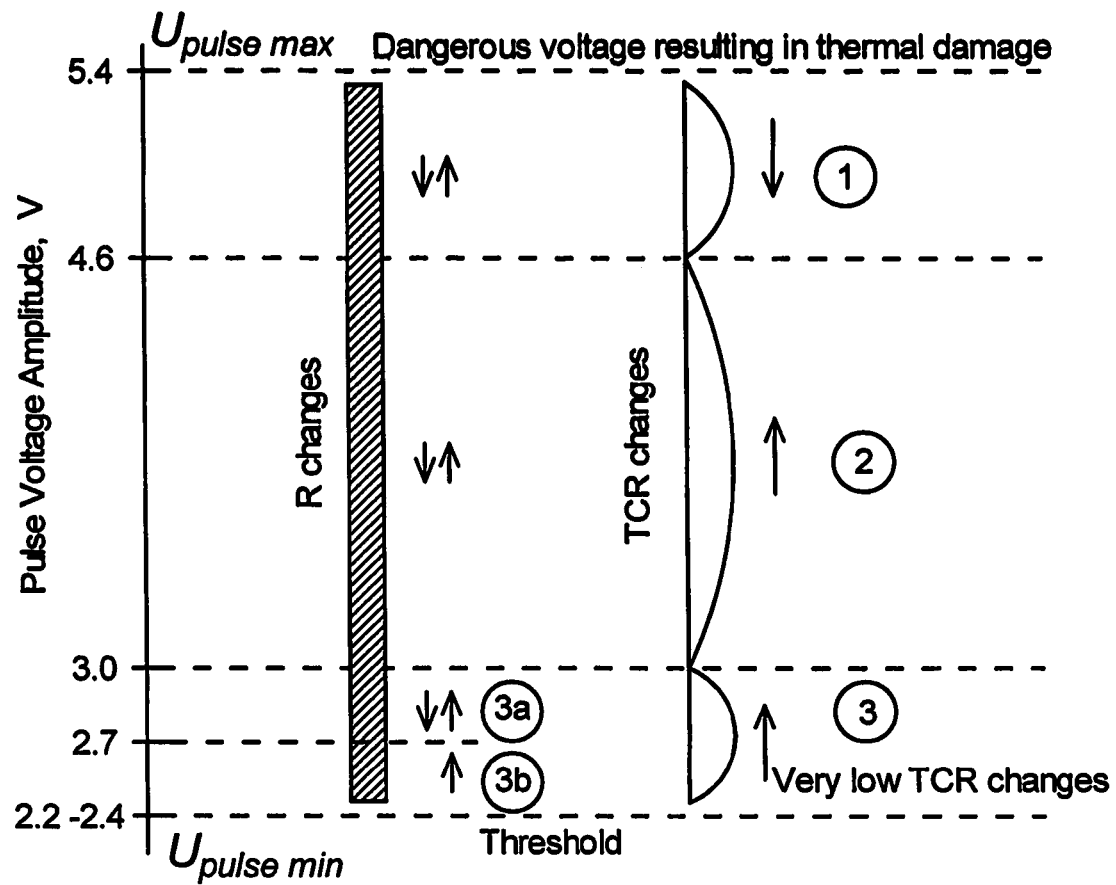
FIG. 4: Shows schematically an example of the effect of heating pulse amplitude on an example of a microstructure, in the context of a TCR-change cycle.

Without limiting the generality of the foregoing, much of the above phenomena are schematically described in FIGS. 3 and 4, based on the circuit in FIG. 2, and for a particular example of a particular polysilicon, layout, heater, and position in the resistance adjustment range, as discussed above.

The circuit shown in FIG. 2 provides a suitable embodiment to explain the principles. It contains two electrically-trimmable polysilicon resistors $R_{x1}$ and $R_{x2}$. Each of these resistors is placed on separate thermally-isolated microstructures, together with auxiliary heaters $R_{h1}$ and $R_{h2}$. The functional resistors are connected in a Wheatstone bridge with two metal resistors $R_1$ and $R_2$, and powered by a constant voltage of 2.5V. The differential voltage at the two midpoints of the bridge, designated $U_{Br1}$ and $U_{Br2}$ in FIG. 2, is amplified by instrumentation amplifier A and processed by external data acquisition board (not shown). The structure also contains polysilicon resistor $R_c$ placed on a separate thermally isolated microstructure between resistors $R_{x1}$ and $R_{x2}$ such that its heating cause by applied voltage $U_{heat}$ results in symmetric (equal) temperature rise in the functional resistors $R_{x1}$ and $R_{x2}$. In case the temperature of the chip needs to be measured, a polysilicon resistor $R_t$ with TCR ~900 ppm/K is placed nearby on the chip (not on the microstructure). It is connected in series with metal resistor $R_3$, the divider being powered by 2.5V. The voltage $U_t$ is processed to calculate the chip temperature.

Beginning from an unbalanced bridge differential voltage, resistor $R_{x1}$ is trimmed until the bridge is balanced (until amplifier output $U_{out}$ is close to zero. This represents the trimming of resistor $R_{x1}$ to its target resistance $R_{target}$ (see below).

FIG. 3 schematically depicts an example sequence of operations to adjust TCR. Each time the resistance is trimmed away from $R_{target}$, (seen in the excursions away from $U_{out}=0$ in FIG. 3a), the TCR of $R_{x1}$ changes (seen in the changes in the RTCR of the bridge in FIG. 3b). The direction and magnitude of the change in TCR relates in a non-trivial manner to the direction and magnitude of the initial change away from $R_{target}$ (represented by the leftmost arrow up or down at each resistance deviation). FIG. 3b shows the corresponding TCR shifts after resistance adjustment pulse sequences (deviation from $R_{target}$ by higher amplitude "first" pulses and resistance-restoration back to $R_{target}$ by lower-amplitude pulses). Note that higher amplitude heating pulses result in more substantial resistance reduction. In general, the procedure to change TCR while maintaining a given resistance value, involves TCR-change cycles, or heating cycles, each causing deviation of resistance away from its given resistance value ($R_{target}$), and then causing restoration of the resistance back to $R_{target}$.

FIG. 4 summarizes very schematically an example of the effect of heating pulse amplitude on an example of a microstructure with a particular variation of polysilicon, and an auxiliary resistive heater of 960 Ohms, and a given $R_{target} \approx 0.8*R_{init}$. Note that quantitative experimental data such as these can differ depending on polysilicon variation, or microstructure layout, or $R_{target}$ deviation from $R_{init}$. For the purposes of resistance and TCR trimming, the heating pulse voltage must be higher than approximately $U_{pulse-min}=2.4V$ (since lower voltages do not initiate resistance change), and must be lower than approximately $U_{pulse-max}=5.4V$ (since extreme heating can cause damage to the heating resistor). (Note also that $R_{min}$ and $R_{max}$ can vary from resistor to resistor, depending on a variety of conditions). If the pulse amplitude of the "first" heating pulse (or pulses) in a TCR-change cycle, is higher than 2.7V and lower than 5.4V, resistance can be first reduced down from the target value of $R_{target} \approx 0.8*R_{init}$ and then restored back. This action is designated by the pair of arrows (down, then up). If the pulse voltage is less than approximately 2.7V, only an increase of resistance from Its value of $R_{target} \approx 0.8*R_{init}$ is possible. On the right side of FIG. 4 are shown the corresponding behaviours of TCR, as a function of the voltage of the "first" pulse in a a TCR-change cycle. (Thus this figure describes the behaviour of TCR in the context of a TCR-change cycle, where the vertical axis represents the amplitude of the "first" pulse in the TCR-change cycle). The thresholds defined in the figures at 5.4V, 4.6V, 3.0V, 2.7V, and 2.2-2.4V, are amplitudes of pulses, which translate into temperature thresholds, which affect the TCR of the resistance differently, depending on the region of the graph (see descriptions of the regions below). The threshold defined by 4.6 is an approximate temperature coefficient change reversal threshold because the direction of trimming of the TCR changes when that threshold is crossed.

The voltage range can be conditionally divided Into several regions of TCR behavior:

Region 1. TCR-change cycles having "first" heating pulse (or pulses) with amplitude in this range, followed by "resistance-restoration" pulses, give a decrease of TCR. The higher the amplitude of the "first" pulse (or pulses) the more significant will be the reduction of TCR.

Region 2. TCR-change cycles having "first" heating pulse (or pulses) with amplitude in this range, applied AFTER a TCR-change cycle which began with a "first" pulse from Region 1, followed by "resistance-restoration" pulses, gives increase of TCR. Over most of this Region 2, the lower the amplitude of this "first" pulse (or pulses), the lower will be the increase of TCR (except near the boundary to Region 1.

Region 3. Very low increase in TCR occurs while the resistance can be either increased or decreased from the value of $R_{target} \approx 0.8*R_{init}$ (region 3a), or only increased, by very low (just-above-threshold) heating pulses (region 3b). The lower the amplitude of the "first" pulse (or pulses) in this region, the lower will be the increase of TCR.

Given that one has the ability to make a calibrated or uncalibrated measurement of (or infer, from other circuit information), the resistance and TCR of a given physical resistance element (passive resistance element), to enough precision for the manipulations described below, it is possible to trim the TCR of polysilicon resistors, for a given resistance value (the given resistance being maintained at its initial value, to a given precision).

The technique of TCR adjustment involves the following steps:

(a) Initial trimming operation from initial resistance value (as-manufactured or other initial value), to target resistance value, $R_{target}$. This $R_{target}$, must be within the range (see FIG. 4), between the trimming threshold below and dangerous voltages above. This initial adjustment of resistance is done using pulsed-trimming techniques as described above, to desired precision $\delta R$ (e.g. within $\delta R=20$ ppm of $R_{target}$).

(b) Recording of last resistance trim "down" pulse amplitude.

(c) Measurement and recording of $R_{actual}$ with precision sufficient to determine whether it is within $\delta R$ of $R_{target}$.

(d) Measurement and recording of $TCR_{actual}$ to sufficient precision $\delta TCR$ (e.g. within $\delta TCR=1$ ppm/K):

(e) Decision of desired direction of TCR-adjustment and specification of target TCR value ($TCR_{target}$). This depends on characteristics of the poly known from the manufacturing process and initial measurements.

(f) Intentional adjustment of resistance away from $R_{target}$, such that $R_{actual}$ is increased or decreased: The amount trimmed away from R-target is decided according to the principles described above.

(g) Intentional trimming of resistance back to R-target, in the opposite direction from that which resulted from step (f) above.

(h) Measurement of new $TCR_{actual}$. Depending on direction and extent of trimming in step (f), the measured $TCR_{actual}$ will be increased or decreased. Also, the extent of TCR trimming will depend on the extent of resistance trimming in step (f).

(i) Iterate steps (e-h), in an adaptive manner until $TCR_{actual}$ is equal to target TCR-value within desired precision $\delta TCR$.

Note that pulses just above the threshold for resistance-trimming tend to change the TCR negligibly (less than $\delta TCR$), and therefore, this case typically doesn't require a step (g) to restore resistance—one would usually only use this case to fine-tune resistance, after TCR was already within $\delta TCR$ of the desired TCR value.

In the later steps of iteration, use full precision $\delta R$, (looser precision being preferred in initial steps because they take shorter time). In step (g) R is measured. If, at this point, it is anticipated that there remain more cycles in the procedure, this R trimming can be done to a somewhat looser precision $\delta R_{intermediate}$, in order to save time. Resistance trimming with full precision (taking more time) need only be done if one is increasing the TCR and close to the target, say within $2*\delta R_{intermediate}$ below $R_{target}$.

Considerations on resistance trimming accuracy after each TCR-trimming cycle: It has been disclosed in prior art that change in trimmed resistance is accompanied by change in TCR (see FIG. 1). Therefore, inaccurate resistance restoration after each TCR-trimming cycle may give certain error in actual TCR measurement. In our case, TCR increases by approximately 400 ppm/K when resistance is decreased by 25%. Hence 10 ppm in resistance trimming gives approximately $1.6 \cdot 10^{-2}$ ppm/K shift in measured TCR. If the required accuracy in trimming TCR is say, 0.1 ppm/K, an inaccuracy in R-trimming of 60 ppm is acceptable. On the other hand, less rigorous requirements on R-trimming accuracy would simplify resistance restoration, which could then be done faster. At the final stage of R and TCR adjustment, after TCR has been adjusted to its target value with required precision, fine tuning of resistance with required precision (say, 10 ppm) can be done (region 3a and 3b in FIG. 4).

Figure 5:
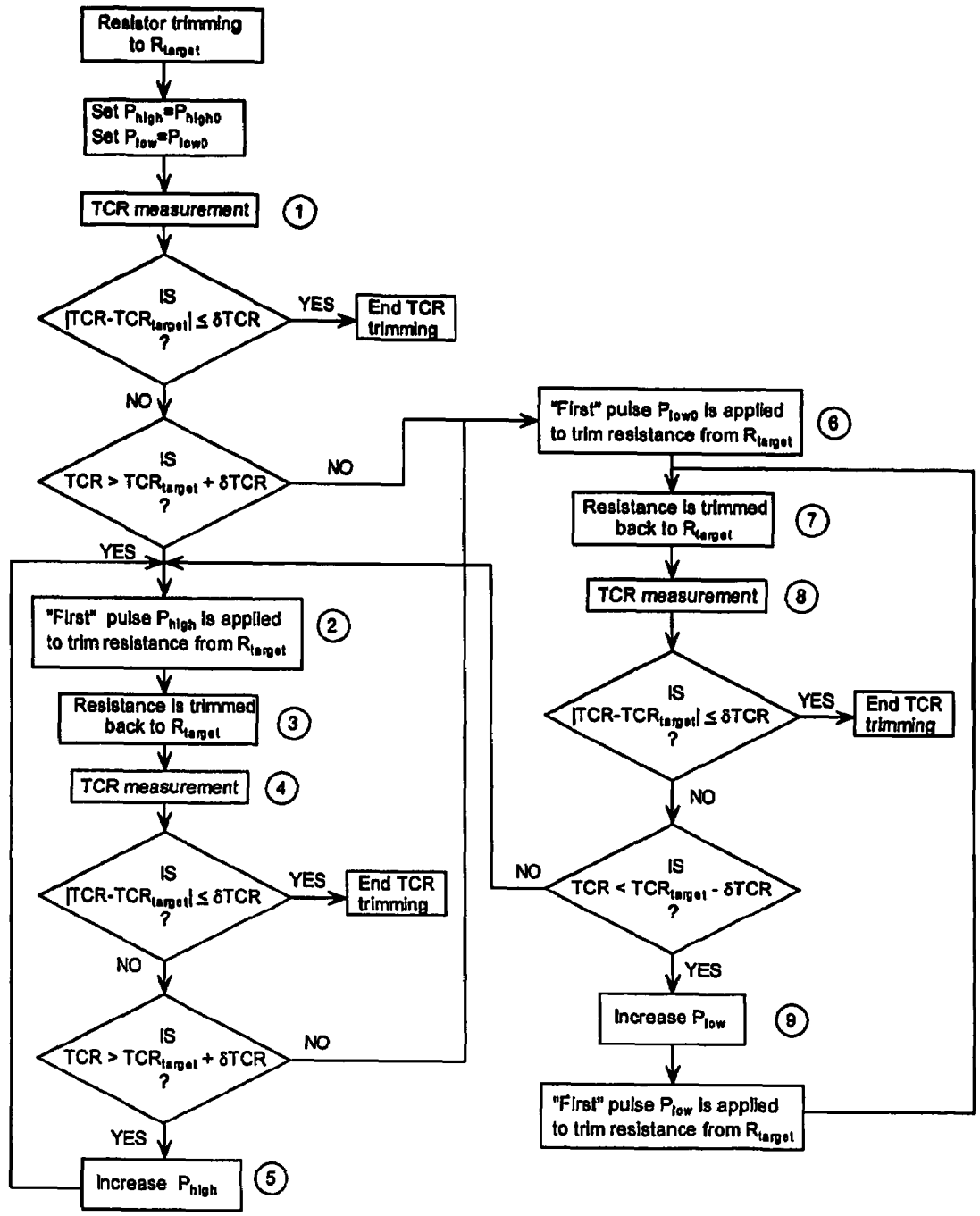
FIG. 5: Shows a flowchart of the TCR adjustment algorithm.
Figure 6:
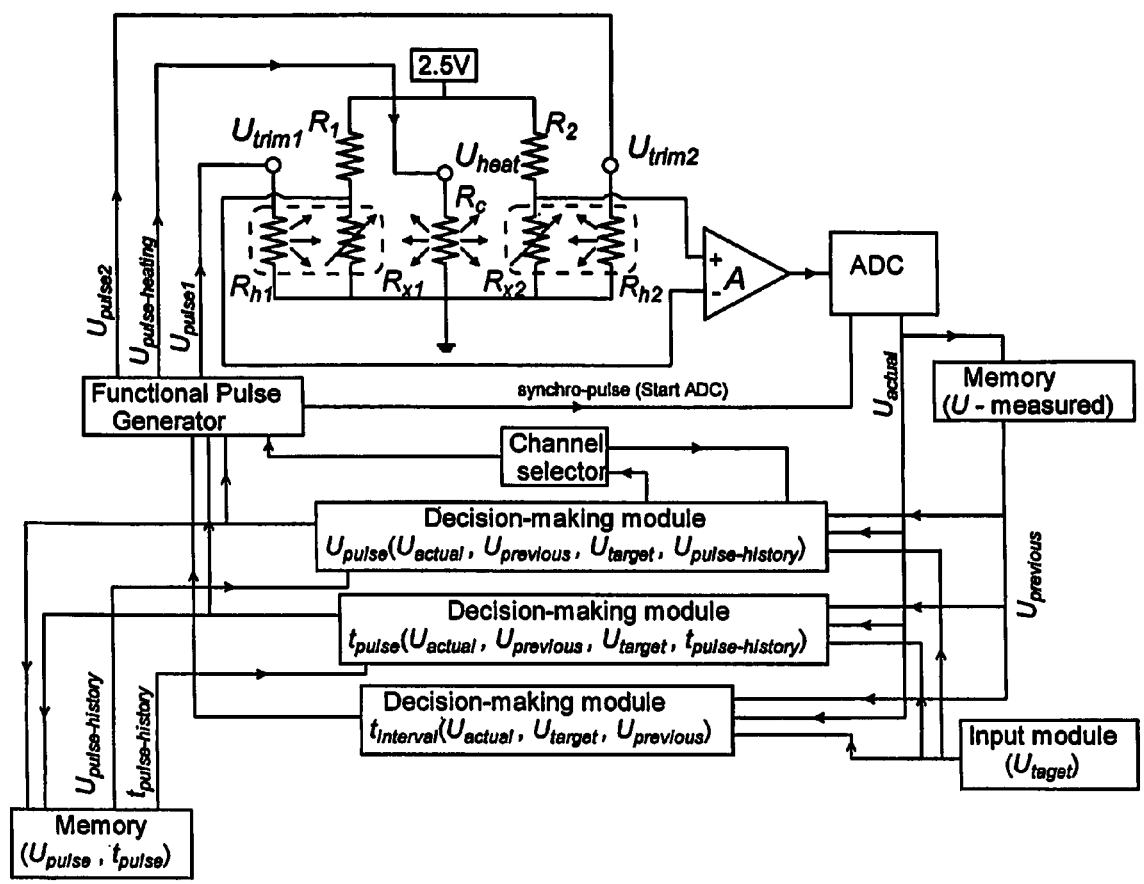
FIG. 6: Shows a schematic block diagram of the circuitry for bi-directional TCR adjustment.

The method of electro-thermal trimming of TCR includes the following steps, diagrammed in FIG. 5. The procedure begins by trimming the resistance to a certain target value $R_{target}$ ($R_{min} < R_{target} < R_{max}$). Initial "first" pulse amplitudes $P_{low0}$ and $P_{high0}$ are set to be $1.05*U_{pulse-max}$ and $1.8*U_{pulse-min}$, respectively.

1) After trimming of the resistance to the certain target value, the TCR is measured. If TCR differs from its target value $TCR_{target}$ by less than $\delta TCR$, where $\delta TCR$ is an acceptable precision, then the trimming process is finished. If TCR must be reduced ($TCR > TCR_{target} + \delta TCR$), go to step 2. If TCR must be increased ($TCR < TCR_{target} - \delta TCR$), go to step 6.
2) Heating pulse $P_{high}$ is applied, resulting in decrease of the resistance $R_{actual}$ (trimming "down"). Initially $P_{high}$ is set to $P_{high0}$, to be incremented each time step 5 is executed.
3) Resistance is trimmed back to its target value $R_{target}$.
4) TCR is measured. If TCR differs from its target value $TCR_{target}$ by less than $\delta TCR$, the trimming process is finished. If further TCR reduction is needed ($TCR > TCR_{target} + \delta TCR$), go to step 5. If TCR must be increased ($TCR < TCR_{target} - \delta TCR$), go to step 6.
5) The "first" heating pulse $P_{high}$, is incremented, and the procedure loops back to step 2, to apply a pulse higher than the previous. Steps 2, 3, 4 and 5 are repeated in a loop until TCR differs from its target value $TCR_{target}$ by less than $\delta TCR$, or until the actual TCR goes below $TCR_{target}$.
6) To increase TCR, a low "first" heating pulse $P_{low}$ is applied. The effect of this pulse may be to increase or decrease resistance. At the beginning of any TCR-change cycles whose goal it is to increase TCR, the pulse amplitude may begin at $P_{low0}$, or may begin at a higher value of $P_{low}$, for example if it is known from experience with a certain batch of devices that an optimal rate of TCR change can be obtained at such a higher value of $P_{low}$. Also, the "first" pulse width may be varied in order to modulate the rate of TCR change in this phase.
7) Resistance is trimmed back to its target value $R_{target}$.
8) TCR is measured. If TCR differs from its target value $TCR_{target}$ by less than $\delta TCR$, then the trimming process is finished. If further TCR increase is needed ($TCR < TCR_{target} - \delta TCR$), go to step 9. If TCR must be reduced ($TCR > TCR_{target} + \delta TCR$), go to step step 2 (where the last known $P_{high}$ pulse will be applied.).
9) The "first" heating pulse $P_{low}$, is incremented higher than used in the immediately previous increasing cycles, and then the next $P_{low}$ is applied. Steps 7, 8 and 9 are repeated in a loop until TCR differs from its target value $TCR_{target}$ by less than $\delta TCR$, or until the actual TCR goes above $TCR_{target}$.

In the case where the TCR were near to zero, and where the goal of adjustment were to reduce the TCR to zero in a small-enough range around zero, accurate knowledge of the temperature reached during TCR measurements would not be necessary. In this case, many different TCR-measurement-heater geometries and techniques would be effective.

The above-described techniques may be applied in applications where the relative TCR of two or more resistance elements is important. In these cases, one does not necessarily need to measure the temperature very accurately, but one does need to know that both (or all) of the resistance elements in question are, to the extent possible, at the same temperature. This may be effectively accomplished by using a heater geometry centrally positioned between two symmetric functional resistors. Other symmetric heater layouts are also available.

A very important example is where one wants the RTCR of a voltage divider to be as close to zero as possible. Another important example concerns the use of thermo-resistors in sensors. For example, in a thermo-anemometer-based pressure or flow sensor, one desires the functional resistors to have quite high individual TCR (for maximum sensitivity of the sensor), simultaneously with excellent matching of the TCR's of the same functional resistors. In this case, there is usually already a central heater (part of the function of the thermo-anemometer), which can be used here for the additional purpose of measuring the TCR by heating the sensing resistors symmetrically.

Figure 19:
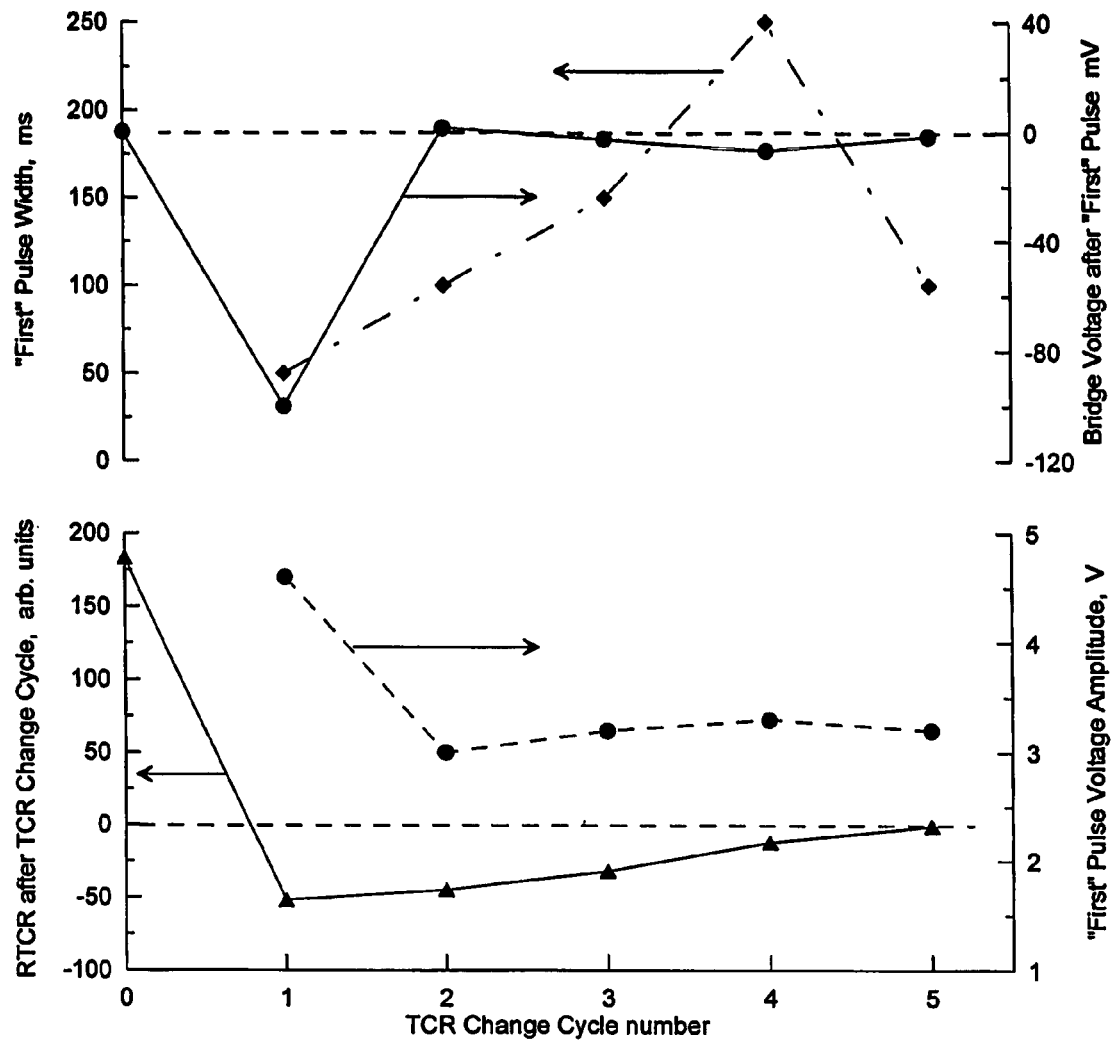
FIG. 19: Shows graphs of experimental data regarding several TCR-change cycles, trimming the RTCR of two resistors to very high precision.

FIG. 19 is a graph showing the effect of "first" heat pulse on the TCR of a resistor (seen in RTCR of a bridge circuit shown in FIG. 2). After balancing of the bridge to zero, with approximately +/−10 ppm of accuracy, a central heater $R_c$ was used to heat resistors $R_{x1}$ and $R_{x2}$ up to approximately 40° C. above room temperature, in order to measure RTCR. Before the beginning of TCR-change cycles, the RTCR was found to be 183 arbitrary units, where 10 arbitrary units corresponds to 3 ppm/K within better than 50% of 3 ppm/K. Since the initial RTCR was positive, a TCR-change cycle involving $P_{high}$ was applied in TCR-change cycle #1. The resistance deviation (seen in the upper part of FIG. 19), due to the "first" pulse of this cycle, was such that the bridge became unbalanced to −100 mV. Following the procedure, the resistance was then restored such that the bridge was balanced, and the new TCR was measured, and found to have changed substantially— from +183 to −52 arbitrary units. Since this was below the target RTCR of zero, the next TCR-change cycle (#2) used a "first" pulse $P_{low}$, in order to raise the TCR (RTCR). The $P_{low}$ was chosen to be above $P_{low0}$ in this case, based on experience with this particular set of devices. The effect of that "first" pulse was an imbalance of the bridge by a small amount in the positive direction, to +3 mV. After subsequent restoration of the bridge balance, the effect on TCR was a small Increase, from −52 to −45 arbitrary units. The remainder of the TCR-change cycles #3, #4, and #5 were applied in a similar manner, with varying pulse widths (adaptively varied as a function of "distance" to the target) and Plow "first" pulse values, each time raising the TCR, until RTCR substantially better than 1 ppm/K was obtained after finally rebalancing the bridge at the end of TCR-change cycle #5. Note that the behaviour of resistance (upper plot) is not intuitive with respect to the behaviour shown in the other curves.

The manipulations represented in FIG. 19 would take less than approximately 20 seconds in an automated mode. Note that the TCR-change cycle #1 took the most time, approximately 6 seconds, due to the long resistance rise ("recovery") needed to rebalance the bridge after the high-amplitude "first" pulse which decreased the resistance. The other cycles each took 1-3 seconds. Execution of the RTCR measurements took approximately 50 ms (requiring primarily the time to heat the functional resistors, and make the measurement at the elevated temperature, since the room-temperature resistance was already known.

The following data accompany the graphs in FIG. 19:

1st Cycle "first" pulse: 4.6V, 50 ms. RTCR (bridge rebalancing)=−52 arb units.
2nd Cycle "first" pulse: 3.0V, 100 ms. RTCR (after bridge rebalancing)=−45 arb units.
3rd Cycle "first" pulse: 3.2V, 150 ms. RTCR (after bridge rebalancing)=−32 arb units.
4th Cycle "first" pulse: 3.3V, 250 ms. RTCR (after bridge rebalancing)=−12 arb units.
5th Cycle "first" pulse: 3.2V, 100 ms. RTCR (after bridge rebalancing)=1 arb unit.

The circuitry for trimming of the resistor bridge structure can trim resistance and TCR of either of two resistors $R_{x1}$ or $R_{x2}$. The Functional Pulse Generator (function generator) has three output channels. Two of them supply heating pulses to the resistive heaters $R_{h1}$ and $R_{h2}$ for the purposes of trimming of the resistors $R_{x1}$ and $R_{x2}$. The third channel supplies heating pulses $U_{pulse-heating}$ healing to the additional resistive heater $R_c$.

A target of the circuitry is to balance the resistor bridge in order to tune the output voltage of the amplifier A to zero. It is also a target of the circuitry to adjust the difference in TCR (RTCR) of the two resistors so that changes in operating temperature do not unbalance the bridge (do not cause changes of output voltage of the amplifier A). To imitate rise of operational (ambient) temperature, electric power is dissipated in resistive heater $R_c$ located symmetrically between the two functional resistors. The output voltage of the amplifier is measured before and during heating of the resistive heater $R_c$. Depending on the direction and value of shifts in output voltage, the trimming of either resistor $R_{x1}$ or $R_{x2}$ is executed.

The output voltage is measured by the ADC and stored in memory.

The first decision-making module calculates the voltage pulse amplitude to be applied to the auxiliary heater $R_{h1}$ or $R_{h2}$ for the purposes of trimming of the bridge. It also decides which output channel, or combination of channels, of the Functional Pulse Generator should be activated for the next heating pulse. To heat two functional resistors $R_{x1}$ and $R_{x2}$ by the heater $R_c$, the decision-making module sends command to the channel selector to choose the appropriate channel and commands the functional pulse generator to produce heating pulse with a certain amplitude. The voltage pulse amplitude calculated by the first decision-making module may depend on the choice of the channel used for the previous heating pulse and is a function of the actual (last measured) output voltage $U_{actual}$, target voltage $U_{target}$ ($U_{target}=0$), voltage measured after previous trimming pulse $U_{previous}$ (stored in the memory), and voltage pulse amplitudes of previous pulses $U_{pulse-history}$:

$$U_{pulse}(U_{actual}, U_{target}, U_{previous}, U_{pulse-history}).$$

The second decision-making module calculates pulse width as function of $U_{actual}$, $U_{target}$, $U_{previous}$ and $t_{pulse-history}$:

$$t_{pulse}(U_{actual}, U_{target}, U_{previous}, t_{pulse-history}).$$

The third decision-making module calculates the interval between pulses as function of $U_{actual}$, $U_{target}$, $U_{previous}$:

$$t_{interval}(U_{actual}, U_{target}, U_{previous}).$$

Pulse parameters $U_{pulse}$, $t_{pulse}$ and $t_{interval}$ and commands to activate one or more of the three output channels are sent to the Functional Pulse Generator. Parameters $U_{pulse}$ and $t_{pulse}$ are stored in memory to be used in the next pulse parameter calculations.

The Functional Pulse Generator also sends synchronizing pulses to the ADC to begin digitizing the analog voltage at the end of the time interval between trimming pulses (before next trimming pulse is applied).

While several examples in the above text show a methodical solution to trimming the TCR or RTCR, some less methodical procedures still succeed in adjusting the TCR or RTCR, albeit with less precision or less efficiency. For example, a procedure based on resistance excursions and restoration, without being particularly mindful of the "first" pulse amplitudes, also succeeds in trimming TCR in a longer time. Even a more random adaptive procedure would in many cases succeed in obtaining a moderately high precision adjustment of TCR.

Using the technique described above to trim TCR independently from resistance, this can be applied to many types of circuits, where the TCR of one or more components within the circuit is trimmed to compensate for temperature variations of other untrimmable components, and thereby adjust various output characteristics of the output signal. General characteristics of such circuits are those containing one or more devices with linear or non-linear input-output temperature characteristics, such as active semiconductor devices. In these cases, the temperature variation of the circuit output can vary linearly or non-linearly, and is suitable for compensation by trimming R and TCR (or RTCR) of one or more trimmable components within the circuit. Even if the adjustable temperature coefficient of the trimmable resistor is linear, it can often be used to compensate (minimize) the temperature variations in certain desired ranges, without fully compensating the non-linear temperature variation over the entire circuit temperature range.

Voltage reference circuits are a very representative example. The pairs R1/R2, and/or R3/R4 and/or R5/R6 can be adjusted. Note that the trimmable resistor technology facilitates the co-adjustment of up to all of the trimmable components R1 to R6, in order to better compensate for the complex behaviors of the active devices in the circuit.

In the present invention, R1, R2, R3 and R4 are all passive resistors, and may all be manufactured from the same resistive layer having nominally the same or approximately the same temperature coefficients of resistance, or from resistive layers having different temperature coefficients of resistance.

Figure 20:
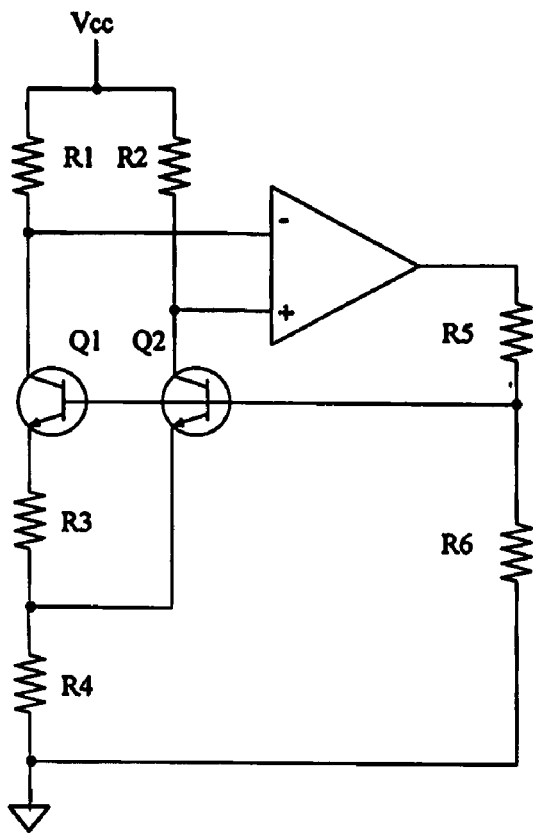
FIG. 20: Shows a typical voltage reference circuit (U.S. Pat. No. 3,887,863), based on the bandgap cell.
Figure 21:
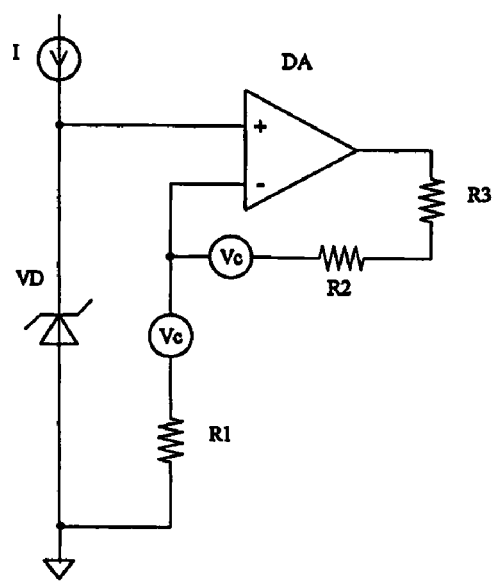
FIG. 21: Shows a typical voltage reference circuit (U.S. Pat. No. 5,252,908), based on the Zener cell.
Figure 22:
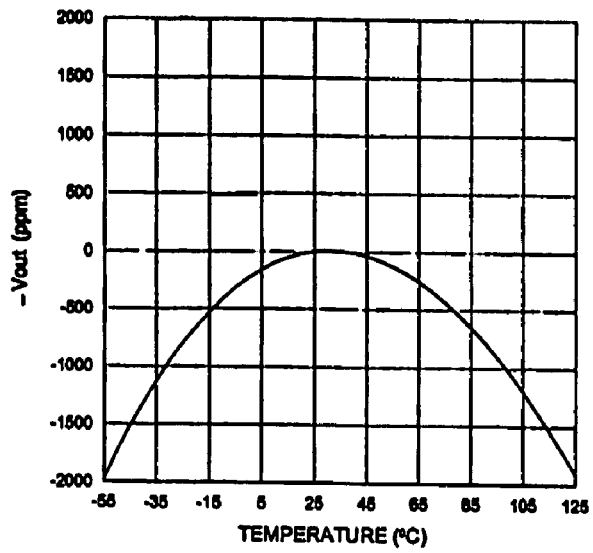
FIG. 22: Shows a simulation of the output voltage vs. temperature for the case of FIG. 20, with R1=R2=10 k-ohms, R3=100.7 ohms, R4=450 ohms, and all resistors and the amplifier having zero temperature variation. This result is also achieved in a variety of other cases, such as when the TCR of R3 and R4 are zero or near zero ppm/K, R1=R2=10 k-ohms with TCR=800 ppm/K. This result is also achieved in a variety of other cases, such as when the TCR of R3 and R4 are 900 ppm/K, R1=9.84 k-ohms with TCR=1000 ppm/K, and R2=10 k-ohms with TCR=900 ppm/K.
Figure 23:
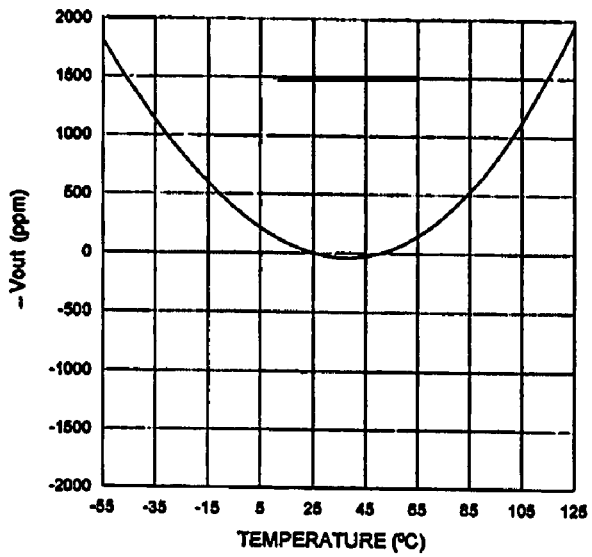
FIG. 23: Shows a simulation of the output voltage vs. temperature for the case of FIG. 20, with R2=10 k-ohms, R3=100.7 ohms, R4=450 ohms, TCR=800 ppm/K for R2, and =0 ppm/K for R3, and R4, and R1=8.90 k-ohms, with TCR=1200 ppm/K.
Figure 24:
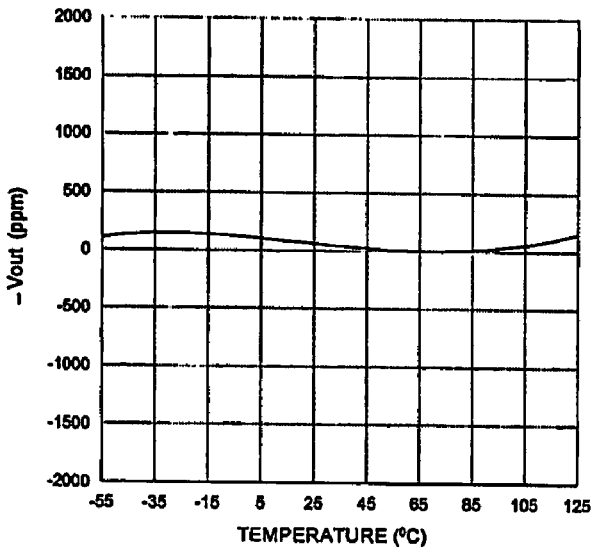
FIG. 24: Shows a simulation of the output voltage vs. temperature for the case of FIG. 20, with R2=10 k-ohms, R3=100.7 ohms, R4=450 ohms, TCR=800 ppm/K for R2, TCR=0 for R3 and R4, and R1=9.283 k-ohms, with TCR=1050 ppm/K. This result is also achieved In a variety of similar cases, such as with TCR of R3 and R4=800 ppm/K.

FIGS. 22, 23 and 24 show simulations of the circuit from FIG. 20, where resistor R1 is subject to trimming. Note that the other resistors R2, R3, or R4 may also be trimmed with similar results. FIG. 22 shows an ideal case where the resistance values are matched, and the TCRs are all zero, so as to give zero linear temperature coefficient for the overall output voltage. Note, however, that the non-linear temperature coefficient is large and there is approximately 2000 ppm of voltage variation over the entire temperature range.

This shape of curve is also achievable by many other variations of parameters. In particular, if R1=R2=10 k-ohms, with TCR=800 ppm/K, and R3=100.7, R4=450, with TCRs zero or near zero, then the same shape of curve as in FIG. 22 is obtained.

FIG. 24 shows a dramatic improvement over FIG. 22, as described in the previous paragraphs, by trimming only the resistance and TCR of R1, the rest of the circuit remaining the same. R1 is trimmed to 9.238 k-ohms, and its TCR is trimmed to 1050 ppm/K, resulting in nonlinear deviation from the nominal voltage being 20× lower, over a range of 180° C. This is overall less than 1 ppm/K. Note that this is being obtained for the bandgap reference cell, for which the typically best attainable value is about 3 ppm/K.

These conditions are quite realistic for electro-thermal trimming of polysilicon resistors as would be found in a typical integrated circuit. Electro-thermal trimming of polysilicon allows trimming down (reduction of resistance) by a significant fraction from its as-manufactured value (PCT/CA02/01366, filed Sep. 10, 2002). The prior-art (U.S. Pat. No. 6,306,718) showed that for typical polysilicon trimming down the resistor results in increase of TCR at a rate of 25 to 30 ppm/K per % of trimming down. This allows increase of the TCR of R1 up to 1000 to 1020 ppm/K from its as-manufactured 800 ppm/K, simply by trimming down the resistance by less than 10% of its as-manufactured value. Further, the TCR of this resistor can be varied in a range of at least a few tens of ppm/K, while maintaining the resistance value within better than 10 ppm of its trimmed value.

If R1 and its TCR were further trimmed, the non-linear temperature variation would re-appear with opposite sign. FIG. 23 shows this effect, for R1=8.9 k-ohms with TCR of 1200 ppm/K.

The improvement in non-linear temperature variation exhibited in FIG. 24 was also simulated and confirmed for the case where R1, R2, R3 and R4 were represented as all being made of the same typical CMOS polysilicon having as-manufactured TCR in the range of 800 ppm/K, but with TCR of R3 being different from the TCR of R4 by 20 ppm/K. In other words, trimming the resistance and TCR of R1 can compensate for minor variations in on-chip resistors.

Another example is that of an amplification circuit for a sensor. The trimmable resistor can adjust the temperature variation of the sensing element. In a typical sensor amplification circuit, (a circuit including a sensing element and circuitry to amplify and condition the electrical output of the sensing element), the offset and gain of the amplifier are critical parameters of interest to the designer of the sensor circuit. The amplifier, and the sensor itself, may have significant non-idealities, including significant parameter variation with temperature (e.g. causing non-trivial offset error and gain error of the overall circuit). In such cases, adjustable resistors can be R-trimmed and/or RTCR-trimmed to compensate for these non-idealities. For example, if the sensitivity of the sensing element itself varies with temperature, the TCR of one or more trimmable resistors can be trimmed to counteract the sensing element's temperature variations.

A sensor in a Wheatstone bridge is another example, where the temperature variation of the output of the sensing element is compensated by adjusting the TCR of the trimmable resistor. The sensing element or elements may also be positioned in a Wheatstone bridge, where the midpoints of the two dividers in the bridge are connected to an amplifier. Here, the amplifier amplifies the voltage difference between those two midpoints. The case of a thermal anemometer would have (for example) the two lower resistors of each divider being the sensing elements positioned symmetrically around a central heating element. When the central heater is heated, and a gas flows across the three resistors in series, the temperature distribution from the central heater is skewed such that it becomes unsymmetrical about the central heater, and one of the side resistors is heated to a higher temperature than the other. When no such gas flow is present, it is desired that the circuit give a zero output. However, even if the two resistors have identical resistances at room temperature, if their TCR's are slightly different, when they are heated by the central heater the circuit will give a non-zero output for a zero-flow input. In this case, one would want to trim one or both TCR's of the sensing resistors to be identical, without disturbing the equality of their resistances. Or if the resistance and TCR's of the two sensing resistances are perfectly matched, but their shape is slightly unsymmetrical about the central heater, the circuit will give a non-zero output for a zero-flow input. In this case, one would want to deliberately mismatch the TCR's and/or resistance of the two sensing elements, in order to compensate for the asymmetry, and obtain zero-output from the circuit when there is zero-flow. This is a particularly interesting case, since trimming of the TCR of a trimmable component, affects a circuit output parameter itself, without necessarily significantly affecting the temperature variation of the output parameter, since the temperature of the two sensing elements is controlled more by the local heater and sensor function than by the ambient temperature.

Furthermore, a circuit in which trimming the resistance and the TCR of a resistor within the circuit would affect the output is a circuit which includes a portion where the temperature is largely controlled not by the ambient temperature, but by a local in-circuit heat-source (such as in a thermal anemometer sensor, with thermally-isolated elements). In this case, it is possible that trimming the temperature variation of a trimmable resistor within that sub-circuit may affect the value of simply an output parameter of the larger circuit, (e.g. voltage offset), without affecting the variation of the output parameter with ambient temperature.

Whatever resistor network is used, this approach can be applicable to one or a plurality of passive resistors, to improve the performance of the voltage reference. It will be understood that numerous modifications thereto will appear to those skilled in the art. Accordingly, the above description and accompanying drawings should be taken as illustrative of the Invention and not in a limiting sense. It will further be understood that it is intended to cover any variations, uses, or adaptations of the invention following, in general, the principles of the invention and including such departures from the present disclosure as come within known of customary practice within the art to which the invention pertains and as may by applied to the essential features herein before set forth.

The invention claimed is:

1. A method for adjusting an output parameter of a circuit, the method comprising:
   (a) providing in said circuit a plurality of components including at least one thermally trimmable resistor and at least one other component, said thermally trimmable resistor possessing a hysteresis characteristic with respect to a dependence of a temperature coefficient on a resistance, and positioning said at least one thermally trimmable resistor in said circuit such that said output parameter is affected by variations of parameters of said at least one thermally trimmable resistor;
   (b) trimming a resistance value and a temperature coefficient of resistance of said at least one thermally trimmable resistor to independent values to cause a change in said output parameter, said trimming said temperature coefficient of resistance done by cycling said resistance value in a first direction away from a starting point and in a second direction back towards said starting point, thereby using said hysteresis characteristic of said thermally trimmable resistor; and
   (c) measuring said output parameter.

2. The method as claimed in claim 1, further comprising repeating steps (b) and (c) until said output parameter has been adjusted as desired.

3. The method as claimed in claim 1, wherein said trimming comprises applying a heating cycle, and said heating cycle comprises a sequence of heat pulses to trim said resistance value in said first direction and a sequence of heat pulses to trim said resistance value in said second direction.

4. The method as claimed in claim 3, wherein said heating cycle trims said resistance value away from and then back to its initial value.

5. The method as claimed in claim 3, wherein said trimming comprises selecting parameters of said heating cycle to determine a direction of trimming and an amount of trimming of said temperature coefficient.

6. The method as claimed in claim 5, wherein said selecting parameters comprises selecting a first heat pulse of said sequence of heat pulses of said heating cycle to be of a given amplitude to determine a change in said temperature coefficient.

7. The method as claimed in claim 6, wherein said trimming comprises driving said temperature coefficient down by using a high amplitude first pulse above a temperature coefficient change reversal threshold, and driving said temperature coefficient up using lower first pulses below said threshold.

8. The method as claimed in claim 6, wherein said trimming comprises providing a heating cycle having a first pulse just above a trimming temperature threshold to obtain a slow rate of change of said parameter, and a negligible change in said temperature coefficient.

9. The method as claimed in claim 3, wherein said trimming comprises applying a plurality of heating cycles.

10. The method as claimed in claim 3, wherein said parameter can be measured at room temperature, and said temperature coefficient of resistance can be measured without changing an ambient temperature of said circuit before applying a succeeding heat pulse.

11. The method as claimed in claim 10, wherein said temperature coefficient is measured during a cooling of said component with respect to an arbitrary scale.

12. The method as claimed in claim 1, wherein said providing in said circuit comprises providing at least one active semiconductor device.

13. The method as claimed in claim 1, wherein said trimming comprises trimming to cause a change to a non-linear temperature variation of an output of said circuit.

14. The method as claimed in claim 1, wherein said trimming comprises trimming to cause a change to an output voltage of said circuit.

15. The method as claimed in claim 1, wherein said providing in a circuit comprises providing a voltage reference circuit having at least one trimmable resistor.

16. The method as claimed in claim 15, wherein said at least one trimmable resistor comprises a pair of trimmable resistors, and said trimming comprises trimming said pair of trimmable resistors.

17. The method as claimed in claim 16, wherein said trimming comprises using said pair of trimmable resistors as a voltage divider to trim.

18. The method as claimed in claim 16, wherein said trimming comprises trimming said pair of trimmable resistors to predetermined resistance values.

19. The method as claimed in claim 16, wherein said trimming comprises trimming said pair of trimmable resistors to a predetermined ratio of resistance values.

20. The method as claimed in claim 16, wherein said trimming comprises trimming said pair of trimmable resistors to matched temperature coefficients of resistance values.

21. The method as claimed in claim 16, wherein said trimming comprises trimming said pair of trimmable resistor to a predetermined temperature coefficient of resistance difference.

22. The method as claimed in claim 15, wherein said providing a voltage reference circuit comprises providing at least one external resistor, external to a chip including said circuit.

23. The method as claimed in claim 22, wherein said at least one trimmable resistor comprises said at least one external resistor, and said trimming comprises trimming said external resistor.

24. The method as claimed in claim 22, wherein said providing at least one external resistor comprises providing a pair of external resistors, said at least one trimmable resistor comprises said pair of external resistors, and said trimming comprises trimming said pair of external resistors.

25. The method as claimed in claim 1, wherein said providing in said circuit comprises providing a thermally trimmable resistor having a range of temperature coefficient values available for trimming such that it can compensate for other components in said circuit.

* * * * *